U S009786361B1

(12) United States Patent
Wang

(10) Patent No.: US 9,786,361 B1
(45) Date of Patent: Oct. 10, 2017

(54) PROGRAMMABLE DECOUPLING CAPACITANCE OF CONFIGURABLE LOGIC CIRCUITRY AND METHOD OF OPERATING SAME

(71) Applicant: Flex Logix Technologies, Inc., Mountain View, CA (US)

(72) Inventor: Cheng C. Wang, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 15/213,933

(22) Filed: Jul. 19, 2016

Related U.S. Application Data

(60) Provisional application No. 62/199,774, filed on Jul. 31, 2015.

(51) Int. Cl.
*G11C 11/419* (2006.01)

(52) U.S. Cl.
CPC ................... *G11C 11/419* (2013.01)

(58) Field of Classification Search
CPC ..................................................... G11C 11/419
USPC ............................................ 365/154; 326/41
See application file for complete search history.

(56) References Cited

U.S. PATENT DOCUMENTS

| | | | | |
|---|---|---|---|---|
| 4,625,234 A * | 11/1986 | Yamada | ................... | H04N 1/648 358/524 |
| 4,912,339 A * | 3/1990 | Bechade | .............. | H03K 17/693 327/410 |
| 5,313,231 A * | 5/1994 | Yin | ......................... | G06F 7/768 345/545 |
| 5,381,454 A * | 1/1995 | Nusinov | ................. | G06T 9/005 377/39 |
| 5,777,505 A * | 7/1998 | LaRue | ................. | H03K 17/693 327/407 |
| 5,905,385 A * | 5/1999 | Sharpe-Geisler | .. | H03K 19/1737 326/39 |
| 6,204,686 B1 * | 3/2001 | Agrawal | .......... | H03K 19/17756 326/38 |
| 6,301,225 B1 * | 10/2001 | Murdock | ................. | H03F 3/58 333/101 |
| 6,657,979 B1 * | 12/2003 | Patel | ....................... | H04J 3/047 370/318 |
| 7,151,470 B1 * | 12/2006 | Xue | ........................ | H03M 7/04 341/61 |
| 7,580,824 B1 * | 8/2009 | Lewis | ................. | G06F 17/5036 703/14 |

(Continued)

*Primary Examiner* — Vu Le
*Assistant Examiner* — Sung Cho
(74) *Attorney, Agent, or Firm* — Neil A. Steinberg

(57) ABSTRACT

An integrated circuit comprising at least one logic tile including a plurality of multiplexers interconnected into a network configuration, wherein each multiplexer includes a plurality of inputs, an output and a plurality of selection inputs to receive selection signals to determine whether an input of the plurality of inputs is connected to the output. The logic tile further includes (i) at least one inactive multiplexer having an output that is inactive in the network configuration and/or (ii) at least one static multiplexer receiving static selection signals, wherein during operation of the integrated circuit, the selection inputs of the inactive and/or the static multiplexer receive selection signals responsively connect (whether directly or indirectly) two or more inputs of the inactive and/or the static multiplexer to the output of the inactive multiplexer.

20 Claims, 18 Drawing Sheets

(56) References Cited

U.S. PATENT DOCUMENTS

| | | | | |
|---|---|---|---|---|
| 7,653,891 B1* | 1/2010 | Anderson | ............ | H03K 17/005 |
| | | | | 326/41 |
| 7,663,401 B1* | 2/2010 | Nguyen | ............. | H03K 19/1737 |
| | | | | 326/38 |
| 7,683,664 B1* | 3/2010 | Gaide | .................. | H03K 17/005 |
| | | | | 326/113 |
| 8,704,549 B1* | 4/2014 | Parpia | ............... | H03K 19/17736 |
| | | | | 326/101 |
| 2002/0186044 A1* | 12/2002 | Agrawal | ............ | H03K 19/1737 |
| | | | | 326/41 |
| 2010/0079166 A1* | 4/2010 | Chan | ................ | H03K 19/17736 |
| | | | | 326/41 |
| 2014/0028366 A1* | 1/2014 | Chou | ..................... | H03H 11/26 |
| | | | | 327/276 |

* cited by examiner

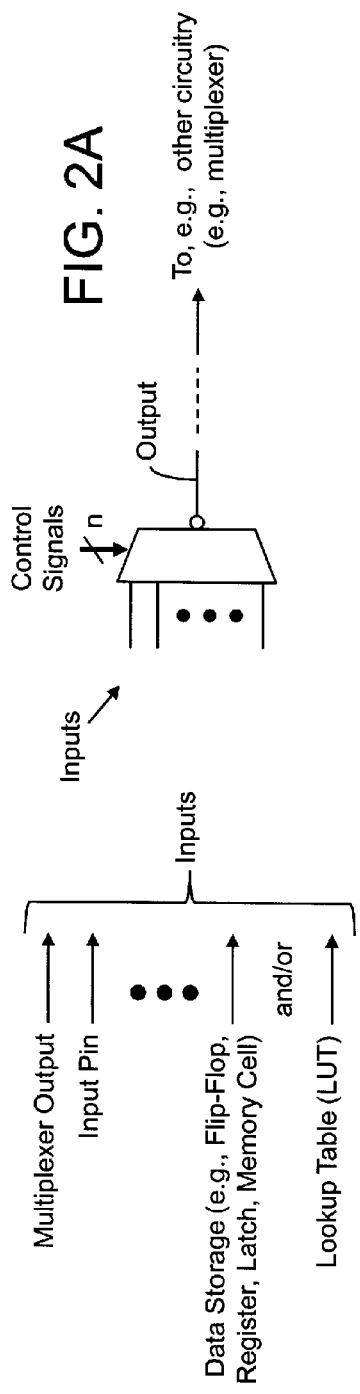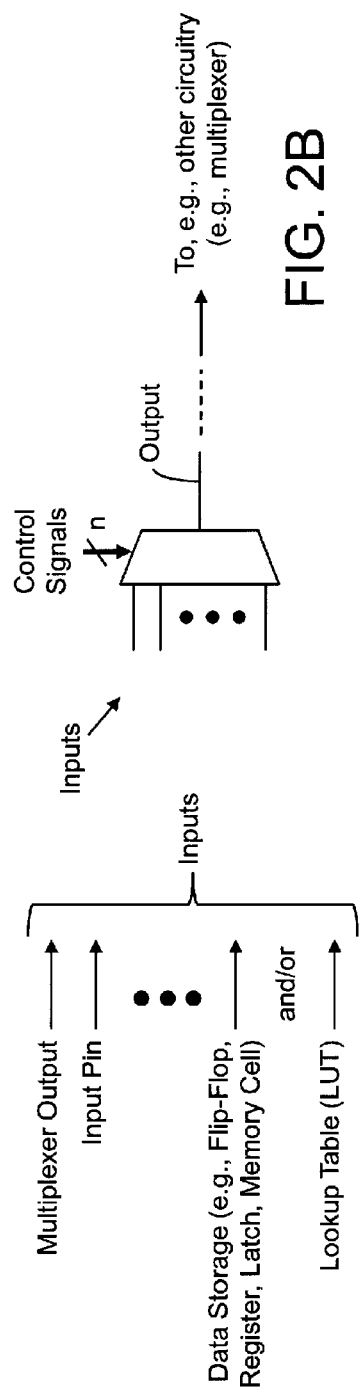

PROGRAMMABLE DECOUPLING CAPACITANCE OF CONFIGURABLE LOGIC CIRCUITRY AND METHOD OF OPERATING SAME

RELATED APPLICATION

This non-provisional application claims priority to U.S. Provisional Application No. 62/199,774, entitled "Programmable Decoupling Capacitance of Configurable Logic Circuitry and Method of Operating/Controlling Same", filed Jul. 31, 2015, which is incorporated herein by reference in its entirety.

INTRODUCTION

In one aspect, the present inventions are directed to circuitry and methods of providing, modifying and/or adjusting a decoupling capacitance and/or a resistance of the decoupling capacitance path of a processor, controller, state machine, gate array, programmable gate array (PGA), field programmable gate array (FPGA), and system-on-chip (SOC) (hereinafter collectively "integrated circuit") by suitably programming one or more inactive or unused multiplexers of the integrated circuit (via application of appropriate data states to the multiplexer inputs and/or control signals), for example, after manufacture, during initialization or start-up, and/or in situ. Notably, an unused or inactive multiplexer may be characterized as a multiplexer whose output is not used in the current configuration of, for example, a programmable logic component, and/or in the performance of a logic operation in or during normal operation of the currently configured integrated circuit.

For example, in one embodiment of the present inventions, unused or inactive multiplexers (such as, one whose output is static, inactive, not-utilized, and/or disabled) are configured to increase decoupling capacitance by incorporating parasitic capacitance(s) of transistors of unused or inactive multiplexers into the decoupling path. Such multiplexers are configured via selection of one, some or all of the multiplexer inputs through application of the appropriate multiplexer control signals corresponding to such selected inputs—and, in this way, coupling such inputs to the multiplexer output. Here, one, some or all of the inputs of the unused or inactive multiplexer are connected (whether directly or indirectly (e.g., through one or more conductors, intermediate devices and/or elements (active or passive elements) and/or via inductive or capacitive coupling)) to the output of the multiplexer, via application of appropriate control signal to the multiplexer, to provide a decoupling path from a first voltage (e.g., $V_{DD}$ or power) to a second voltage (e.g., $V_{SS}$ or ground), in part, using parasitic capacitances of the transistors of the multiplexer.

In one embodiment, control circuitry may determine/identify inputs of the unused or inactive multiplexer to select, and thereby connected to the multiplexer output, based on the data state or polarity of the input signals. Here, inputs of the unused or inactive multiplexer receiving signals having the same data state or polarity may be employed or incorporated in the decoupling circuitry via suitable programming of the control signals of the input-output selection of the multiplexer. That is, where signals are binary, one, some or all input signals having a "high" or "1" data state or polarity may be configured to connect to the output of the unused or inactive multiplexer (whereas, in this example, the inputs receiving input signals having a "low" data state or polarity are not employed and, as such, not connected to the output of the unused or inactive multiplexer). Similarly, one, some or all input signals having a "low" or "0" data state or polarity may be configured to connect to the output of the unused or inactive multiplexer (whereas, in this example, the inputs receiving input signals having a "high" data state or polarity are not employed and, as such, not connected to the multiplexer output).

In one embodiment, the control circuitry (as programmed, for example, by the user) analyzes the switch fabric to identify unused or inactive multiplexer. Thereafter, the control circuitry selects or enables (via the control signals) a predetermined number(s) or range of inputs of the unused or inactive multiplexer (which may be less than all of the inputs—for example, all of the inputs available to connect to the multiplexer output) to increase a decoupling capacitance of the integrated circuit by incorporating parasitic capacitance(s) of transistors of unused or inactive multiplexers into the decoupling path. The predetermined number may be greater than a minimum and/or not to exceed a maximum (which may be all or less than all of the inputs or available inputs of the unused or inactive multiplexer). For example, in the context of a four input multiplexer, the control circuitry may be programmed to select or enable greater than or equal to one input and less than or equal to three inputs (having the same data state or polarity) of an unused or inactive multiplexer to connect such inputs to the output of the multiplexer, via application of appropriate control signal, and thereby provide a decoupling path from a first voltage to a second voltage, in part, using parasitic capacitances of the transistors of the unused or inactive multiplexer. The control circuitry may be programmed, for example, at manufacture, after manufacture, during initialization or start-up, and/or in situ.

Notably, in one embodiment, the inputs signals of an unused or inactive multiplexer are electrically connected to data storage elements, input pins, lookup tables and/or the output of a multiplexer. If such input signals are applied to unused or inactive multiplexer, the control circuitry may suitably program such inputs in order to implement one or more of the inventions described and illustrated herein. Further, in one embodiment, the control circuitry programs the control signals of the multiplexer, for example, via storing the appropriate data in memory cells that are connected to the input-output selection of the multiplexer. The unused or inactive multiplexer may be configured, via the control signals, for example, after manufacture, during initialization or start-up, and/or in situ.

In addition thereto, or in lieu thereof, in another aspect, the present inventions are directed to circuitry and methods of providing, modifying and/or adjusting a resistance of the decoupling capacitance path of an integrated circuit by programming one or more static multiplexers of an integrated circuit. A static multiplexer may be characterized as a multiplexer whose input-output selection is static for a given configuration of, for example, a programmable logic component of an integrated circuit. Here, the control signals which select the input that is electrically connected to the output are static for the currently configured integrated circuit; and, as such, the control signals applied to the static multiplexer do not change for a given configuration of the integrated circuit.

For example, in one embodiment, static multiplexers are configured (via application of appropriate control signals to the static multiplexer) to decrease a resistance of the decoupling capacitance path by electrically coupling one or more (or all) unselected inputs of the static multiplexer to the multiplexer output. Unselected inputs that have the same data state or polarity as the selected input may be electrically connected to the output of the static multiplexer (via control signals applied to the selection transistors of the static multiplexer for the unselected inputs). As such, in this embodiment, more than one input of the static multiplexer is connected to the output (i.e., the selected input and the unselected inputs having the same data state or polarity as the signal applied to the selected input). That is, control signals associated with one, some or all (or a predetermined number—as discussed above in the context of increase a decoupling capacitance of the integrated circuit) of the unselected inputs of the multiplexer is/are programmed to couple the unselected inputs to the multiplexer output (and, in this way, enabling the multiplexer input-output path of the unselected inputs) provided such unselected inputs have the same data state or polarity as the input signal applied to the selected input. Under these circumstances, additional decoupling paths are provided via such unselected inputs, thereby decreasing the resistance of the decoupling capacitance path of the integrated circuit during operation.

Control circuitry (for example, disposed on the integrated circuit) or configuration software (for example, executed external to the integrated circuit and/or internally by the control circuitry) may be employed to identify unused or inactive multiplexers and/or static multiplexers during configuration, initialization or at start-up, in situ and/or post-configuration of the integrated circuit. In addition, the control circuitry or the configuration software may identify the data states or polarity of the signals applied to inputs of the unused or inactive multiplexers and/or static multiplexers. Based thereon, the control circuitry or configuration software may configure or program (i) one or more (or all) unused or inactive multiplexers and/or (ii) one or more (or all) static multiplexers, via applying or implementing control signals, to, for example, increase decoupling capacitance and/or decrease resistance of the decoupling capacitance path. In one embodiment, the control circuitry and/or circuitry external to the integrated circuit (each/either, for example, executing or implementing the configuration software) writes/stores the control data in data storage elements which are connected to the selection or control inputs of such multiplexers during initialization or at start-up, in situ and/or post-configuration of the integrated circuit. In response, certain of the inputs of the unused or inactive multiplexers are connected to the outputs of the respective multiplexers and/or certain of the unselected inputs of static multiplexers are connected to the outputs of the respective multiplexers.

Notably, in one embodiment, a system, user and/or operator may enable or disable, for example, during initialization or at start-up, and/or in situ, the circuitry and techniques to increase a decoupling capacitance and/or decrease a resistance of the decoupling path of an integrated circuit, for example, an FPGA. In one embodiment, the system, user and/or operator may instruct/enable (for example, via storing a value or command in an on-chip mode/operations register) the control circuitry or configuration software of the integrated circuit device to configure one or more (or all) unused or inactive and/or static multiplexers, as described herein, to provide, modify and/or adjust an amount of decoupling capacitance and/or resistance of the decoupling capacitance path. Similarly, the control circuitry may responsively not enable and/or disable the aforementioned configuration by re-programming (or not programming) one or more (or all) unused/inactive and/or static multiplexers and thereby eliminate the impact of such multiplexer(s) on the decoupling capacitance and/or resistance of the decoupling path of the integrated circuit.

As noted above, control circuitry (located on-chip or off-chip) may analyze the switch fabric and select or enable a predetermined number of inputs (which may be less than all of the available number of inputs) of the unused or inactive multiplexer to connect to the multiplexer output. Here, the control circuitry, with knowledge of the switch fabric/states, may select or enable a predetermined number of available inputs of the multiplexer. The predetermined number may be greater than a minimum and/or not to exceed a maximum (which may be less than all of the input or available inputs of the unused or inactive multiplexer). For example, in the context of a five input multiplexer, the control circuitry may select or enable greater than or equal to two inputs and less than or equal to four inputs of an unused, inactive and/or static multiplexer that are available/employed (as described herein) to control a decoupling capacitance and/or a resistance of the decoupling path of an integrated circuit, for example, an FPGA.

The predetermined number may be programmed, for example, at manufacture, after manufacture, during initialization or start-up, and/or in situ. Indeed, the integrated circuit may employ a plurality of predetermined numbers for a given logic tile or a plurality of logic tiles—wherein one or more of the predetermined numbers may depend on, for example, the configuration of the logic tile, the size of the multiplexer, the number of selected inputs of the unused or inactive multiplexer, the number of unused or inactive multiplexers employed for a given logic tile or plurality of tiles and/or power consumption of one or more tiles and/or the integrated circuit.

Briefly, an FPGA is an integrated circuit which may be configured and/or reconfigured (hereinafter, unless stated otherwise, collectively "configured" or the like (for example, "configure", "configuring" and "configurable")) by a user, operator, customer and/or designer before and/or after manufacture. The FPGA includes, among other things, a plurality of tiles having programmable logic components (often called "configurable logic blocks" (CLB), "logic array blocks" (LAB), or "logic tiles"—hereinafter collectively "logic tiles") and a network of configurable interconnects that facilitate communication between the logic tiles. (See, for example, FIGS. 1A and 1B).

Each logic tile typically includes thousands of transistors which may be configured to perform combinational and/or sequential functions (simple and/or complex). Such transistors are interconnected to form a plurality of multiplexers have two or more inputs. The selection inputs of the multiplexers may be electrically connected to data storage elements (for example, memory cells) which, when programmed, determine which input of the multiplexer is connected to the multiplexer output. The memory cells may be static or dynamic. For example, in the context of static memory cells, the selection inputs may be electrically connected to one or more input pins, flip-flops, latches and/or blocks/arrays of memory (for example, SRAM array) that may be programmed after manufacture of the integrated circuit.

BRIEF DESCRIPTION OF THE DRAWINGS

The present inventions may be implemented in connection with embodiments illustrated in the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as ideal, preferred or advantageous, for example, over other embodiments or implementations; rather, it is intended reflect or indicate the embodiment(s) is/are "example" embodiment(s).

FIGS. 2A and 2B illustrate an N-input inverting multiplexer and an N-input non-inverting multiplexer (where N≥2); in the context of a static multiplexer, the data states of the select or control signals are static and the data states or polarity of the signals applied to the inputs (which may originate from, for example, a data storage element (e.g., a memory cell, register, flip-flop, latch, block/array of memory), an input pin, a lookup table (of any kind or type), and/or an output of another multiplexer) may be dynamic or static; the data storage element, input pin and/or lookup table are typically set or programmed with a data state, for example, at power-up or during an initialization sequence;

Figure 1A:
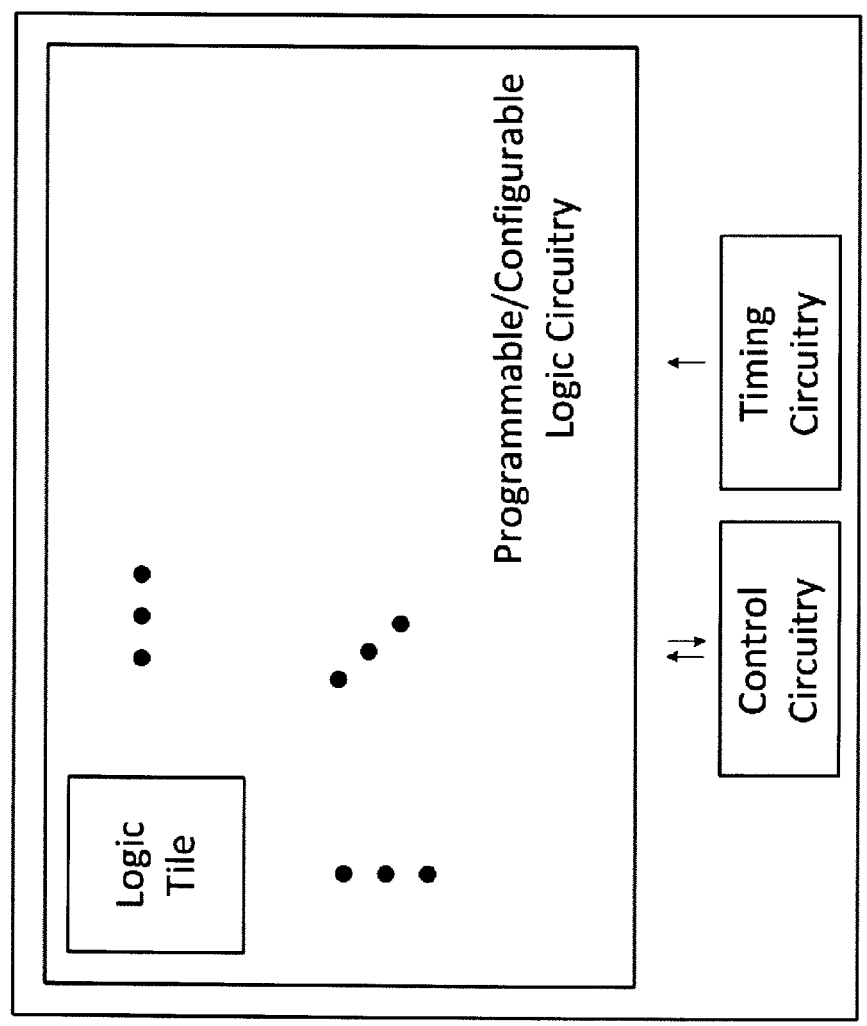
FIG. 1A illustrates a block diagram representation of, for example, an exemplary integrated circuit including control circuitry, clock circuitry and programmable/configurable logic circuitry (which may include one or more logic tiles, each of which includes logic transistors (that may be interconnected, for example, as multiplexers having two or more inputs which are electrically connected to associated data storage elements, input pins and/or lookup tables that, when programmed, determine the operation of the multiplexers))
Figure 1B:
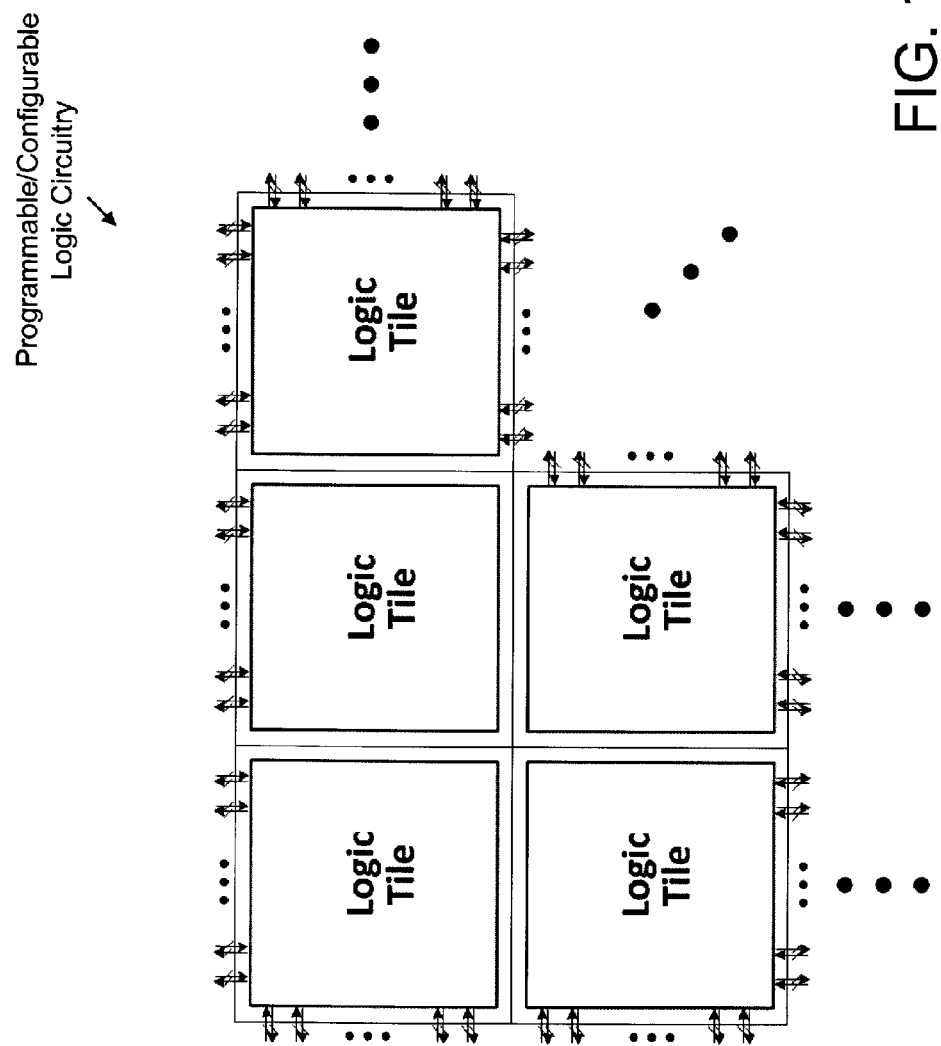
FIG. 1B illustrates a block diagram representation of a plurality of interconnected logic tiles of programmable/configurable logic circuitry, for example, an FPGA, wherein input/output of the logic tiles may facilitate communication between logic tiles and/or circuitry external to the programmable/configurable logic circuitry; notably, the programmable/configurable logic circuitry may be comprised of a plurality of programmable logic tiles wherein each logic tile includes a plurality of multiplexers.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

In a first aspect, the present inventions relate to circuitry and methods of providing, modifying and/or adjusting a decoupling capacitance and/or a resistance of the decoupling capacitance path of an integrated circuit by programming, after manufacture, during initialization or start-up, and/or in situ, one or more inactive or unused multiplexers of the integrated circuit, via application of appropriate select or control signals to the multiplexers to select one or more (or all) inputs having the same data state or polarity and thereby connect such inputs to the output of the multiplexer. Notably, an unused or inactive multiplexer may be characterized as a multiplexer whose output is not used in the current configuration of, for example, a programmable logic component, and/or in the performance of a logic operation in or during normal operation of the currently configured integrated circuit.

For example, in one embodiment of the present inventions, unused or inactive multiplexers are configured, via application of appropriate control signals of the multiplexer, to connect one or more (or all) of the inputs to the output and thereby increase the decoupling capacitance by incorporating parasitic capacitance(s) of transistors of the input-output paths associated with such one or more (or all) of the inputs of unused or inactive multiplexers into a decoupling path of the integrated circuit. Here, one or more (or all) inputs (where signals applied thereto have the same data state or polarity) of an unused or inactive multiplexer is/are connected to the output of such multiplexer (via programming the select or control signals) to provide a decoupling path from a first voltage (e.g., $V_{DD}$ or power) to a second voltage (e.g., $V_{SS}$ or ground), in part, using parasitic capacitances of the transistors of the multiplexer. The one or more (or all) of the inputs of an unused or inactive multiplexer to be connected to the output thereof are selected based on the data state or polarity of the signal applied to the input. That is, where signals are binary, one, some or all input signals having a "high" or "1" data state or polarity may be configured to connect to the output of the unused or inactive multiplexer (whereas, in this example, inputs receiving input signals having a "low" or "0" data state or polarity are not employed and, as such, not connected to the output of the unused or inactive multiplexer). Similarly, one, some or all input signals having a "low" or "0" data state or polarity may be configured to connect to the output of the unused or inactive multiplexer (whereas, in this example, inputs receiving input signals having a "high" or "1" data state or polarity are not employed and, as such, not connected to the multiplexer output). The unused or inactive multiplexer may be configured as described above, for example, after manufacture, during initialization or start-up, and/or in situ. As such, in this embodiment, the unused or inactive multiplexer may have one or more (or all) of the inputs connected to the multiplexer output (via application of control signals to the control inputs of the multiplexer enabling such inputs) wherein the input signals applied to all such inputs (the selected and unselected inputs) have the same data state or polarity.

Notably, the unused or inactive multiplexer may be any multiplexer configuration or type. For example, the unused or inactive multiplexer may be an inverting type or a non-inverting type. (See, for example, FIGS. 2A and 2B, respectively). Further, the input signals applied to the inputs of the unused or inactive multiplexer may originate from data storage elements (e.g., memory cell, register, flip-flop, latch, block/array of memory), input pins, lookup table (LUT), and/or outputs of other multiplexers. (See, for example, FIGS. 2A and 2B). Notably, the control circuitry may suitably program such inputs (in the event such inputs are unused in the current configuration) in order to implement or more fully implement this aspect of the inventions (for example, program a data state in order to increase the number of inputs of an unused or inactive multiplexer that are available to be configured to connect to the output thereof (which, in this way, increase the decoupling capacitance).

In another aspect (which may be employed in conjunction with the previous aspects of the inventions or separately therefrom), the present inventions are directed to circuitry and methods of providing, modifying and/or adjusting a resistance of the decoupling capacitance path of an integrated circuit by suitably programming one or more static multiplexers of the integrated circuit, for example, after manufacture, during initialization or start-up, and/or in situ. As noted above, a static multiplexer may be characterized as a multiplexer whose input-output selection is static for a given configuration of, for example, a programmable logic component of an integrated circuit. Here, the control signals which select input that is electrically connected to the output are static; as such, the control signals applied to the static multiplexer do not change for a given configuration of the integrated circuit.

In one embodiment, for example, one or more static multiplexers of the integrated circuit are configured (based on the data state or polarity of the signals applied to the selected input and unselected inputs, and the control signals associated with such multiplexer inputs) to decrease a resistance of the decoupling capacitance path. Here, provided the signals applied to such unselected inputs of the static multiplexer have the same data state or polarity as the signal applied to the selected input, one or more (or all) unselected inputs of the static multiplexer may be configured to connect the unselected inputs to the multiplexer output via appropriately programming the control or select inputs. In this way, an additional electrical circuit/path is provided for the decoupling capacitance via such unselected inputs by enabling the selection transistors (via the control signals) of the unselected inputs thereby coupling the unselected inputs to the output of static multiplexer during operation of the integrated circuit. As such, in this embodiment, the static multiplexer have more than one multiplexer input connected to the multiplexer output (via application of control signals to the control inputs of the multiplexer enabling such inputs) wherein the signals applied to all such inputs (the selected and unselected inputs) have the same data state or polarity.

Similar to the unused or inactive multiplexers, the static multiplexers may be any multiplexer configuration/type and may be an inverting type or a non-inverting type. (See, for example, FIGS. 2A and 2B, respectively). Further, the input signals applied to the inputs of the static multiplexer may originate from data storage elements (e.g., memory cell, register, flip-flop, latch, block/array of memory), input pins, lookup table (LUT), and/or outputs of other multiplexers. Where such inputs are unused in the current configuration of the integrated circuit, the control circuitry may suitably program such inputs in order to implement or more fully implement this aspect of the inventions (for example, program a data state in order to increase the number of inputs of an static multiplexer that are available to be configured to connect to the output thereof (which, in this way, decrease the resistance of the decoupling path).

Notably, control circuitry (for example, disposed on the integrated circuit) may be employed to identify unused or inactive multiplexers and/or static multiplexers during initialization or at start-up, in situ and/or post-configuration of the integrated circuit.

Figure 7A:
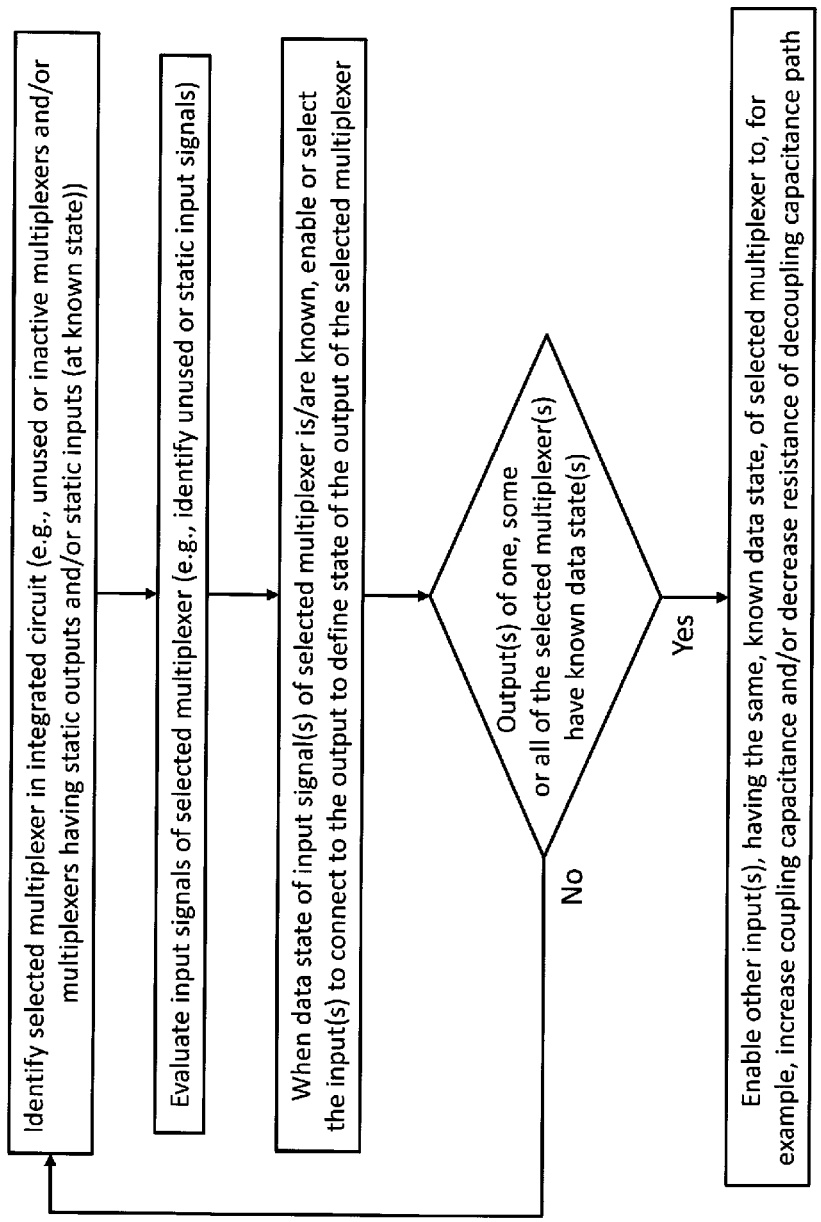
FIG. 7A is a flowchart of exemplary processes of identifying unused or inactive multiplexers and/or multiplexers having static outputs and/or static inputs (at known state) to implement one or more of inventions described and illustrated herein including controlling a decoupling capacitance and/or a resistance of the decoupling path of an integrated circuit, for example, an FPGA; for the avoidance of doubt, the inventions are not limited to processes and/or algorithms implemented in accordance with the flow chart of this figure; indeed, such flow chart is merely exemplary.

In one embodiment, the control circuitry (or external circuitry—i.e., circuitry external to the integrated circuit) evaluates a current configuration of the integrated circuit and determines/identifies unused or inactive multiplexers and/or static multiplexers of the configuration of the integrated circuit. In addition, the control circuitry (or external circuitry) may identify the data states or polarity of the signals applied to inputs of the unused or inactive multiplexers and/or static multiplexers. Based thereon, the control circuitry (or external circuitry) may configure or program (i) one or more (or all) unused or inactive multiplexers and/or (ii) one or more (or all) static multiplexers, via applying or implementing control signals, to, for example, increase decoupling capacitance and/or decrease resistance of the decoupling capacitance path. (See, for example, the exemplary flowchart illustrated in FIG. 7A). In one embodiment, the control circuitry (or external circuitry) writes/stores the control data in data storage elements which are connected to the selection or control inputs of such multiplexers during initialization or at start-up, in situ and/or post-configuration of the integrated circuit. In response, certain of the inputs of the unused or inactive multiplexers are connected to the outputs of the respective multiplexers and/or certain of the unselected inputs of static multiplexers are connected to the outputs of the respective multiplexers.

In one embodiment, a system, control circuitry, external circuitry, user and/or operator may enable or disable, for example, during initialization or at start-up, and/or in situ, the circuitry and techniques to (i) adjust and/or increase a decoupling capacitance and/or (ii) adjust and/or decrease a resistance of the decoupling path of an integrated circuit, for example, an FPGA. For example, the system, external circuitry, user and/or operator may, via a command (for example, stored in an on-chip mode/operations register), instruct the control circuitry of the integrated circuit device to configure one or more (or all) unused/inactive and/or static multiplexers, as described herein, to provide, modify and/or adjust an amount of decoupling capacitance and/or resistance of the decoupling capacitance path. Similarly, the control circuitry may responsively not enable and/or disable the aforementioned configuration by re-programming (or not programming) one or more (or all) unused/inactive and/or static multiplexers and thereby eliminate the impact of such multiplexer(s) on the decoupling capacitance and/or resistance of the decoupling path of the integrated circuit.

In addition thereto, a system, circuitry (located on-chip (internal circuitry) or off-chip (external circuitry)), user and/or operator may analyze the switch fabric and select or enable a predetermined number of inputs (which may be all or less than all of the available number of inputs) of the unused or inactive multiplexer to connect to the multiplexer output. Here, the system, circuitry, user and/or operator, with knowledge of the switch fabric/states, may select or enable a predetermined number of available inputs of the multiplexer. The predetermined number may be all available inputs or may be greater than a minimum and/or not to exceed a maximum (which may be all or less than all of the input or available inputs of the unused or inactive multiplexer). For example, in the context of a six input multiplexer, the system, circuitry, user and/or operator may select or enable greater than or equal to two inputs and less than or equal to four inputs of an unused, inactive or static multiplexer that are available/employed (as described herein) to control a decoupling capacitance and/or a resistance of the decoupling path of an integrated circuit.

The predetermined number may be determined and/or programmed, for example, at manufacture, after manufacture, after defining the switch fabric/states, during initialization or start-up, and/or in situ. The predetermined number may be stored in memory resident on the integrated circuit. Indeed, the integrated circuit may employ a plurality of predetermined numbers for a given logic tile or a plurality of logic tiles—wherein one or more of the predetermined numbers may depend on, for example, the configuration of the logic tile, the size of the multiplexer, the number of selected inputs of the unused or inactive multiplexer, the number of unused or inactive multiplexers employed for a given logic tile or plurality of tiles, and/or power consumption of one or more tiles and/or the integrated circuit.

Figure 3A:
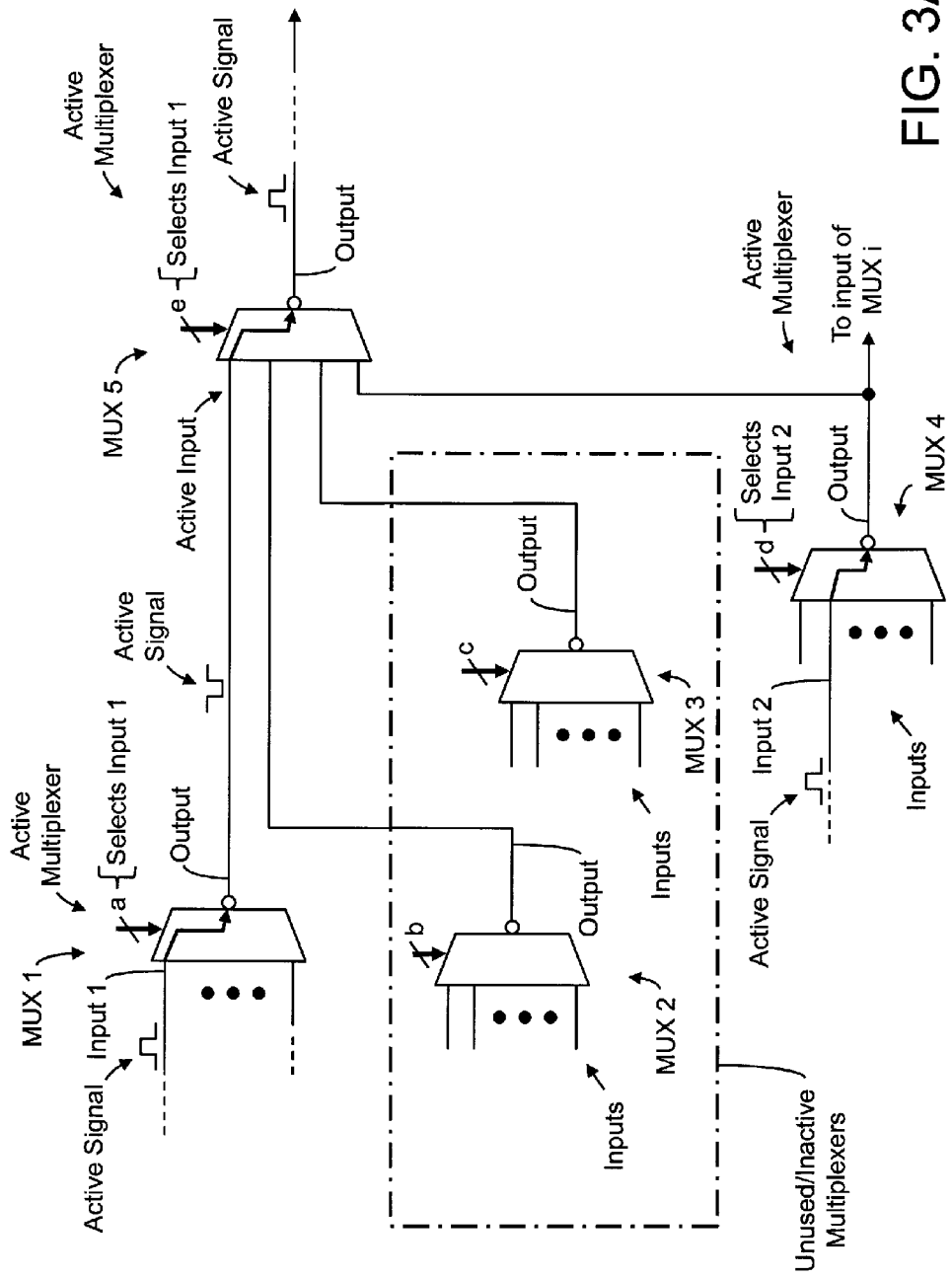
FIGS. 3A-3H illustrate exemplary schematic block diagrams, including a plurality of multiplexers wherein certain multiplexers are used or active in connection with the configuration of the integrated circuit and certain other multiplexers are unused/inactive (and are identified as such in the schematic block diagrams), in accordance with aspects of the present inventions (see, for example, MUX 2 and MUX 3 in FIG. 3A); the data states of the input signals of the multiplexers may be determined by, for example, the data state of a data storage element (e.g., memory cell, register, flip-flop, latch, block/array of memory), an input pin, a lookup table (LUT) and/or an output of a multiplexer (see, for example, FIG. 3D); notably, one or more multiplexers of FIGS. 3A-3H may be static-type multiplexers, for example, the data storage element controlling the input selection remains static after configuration of the integrated circuit; further, one or more multiplexers of FIGS. 3A-3H may be constant multiplexers, where the selected input into the multiplexer is propagating a constant signal (see, for example, Input 2 of MUX 4 in FIGS. 3G and 3H)
Figure 4A:
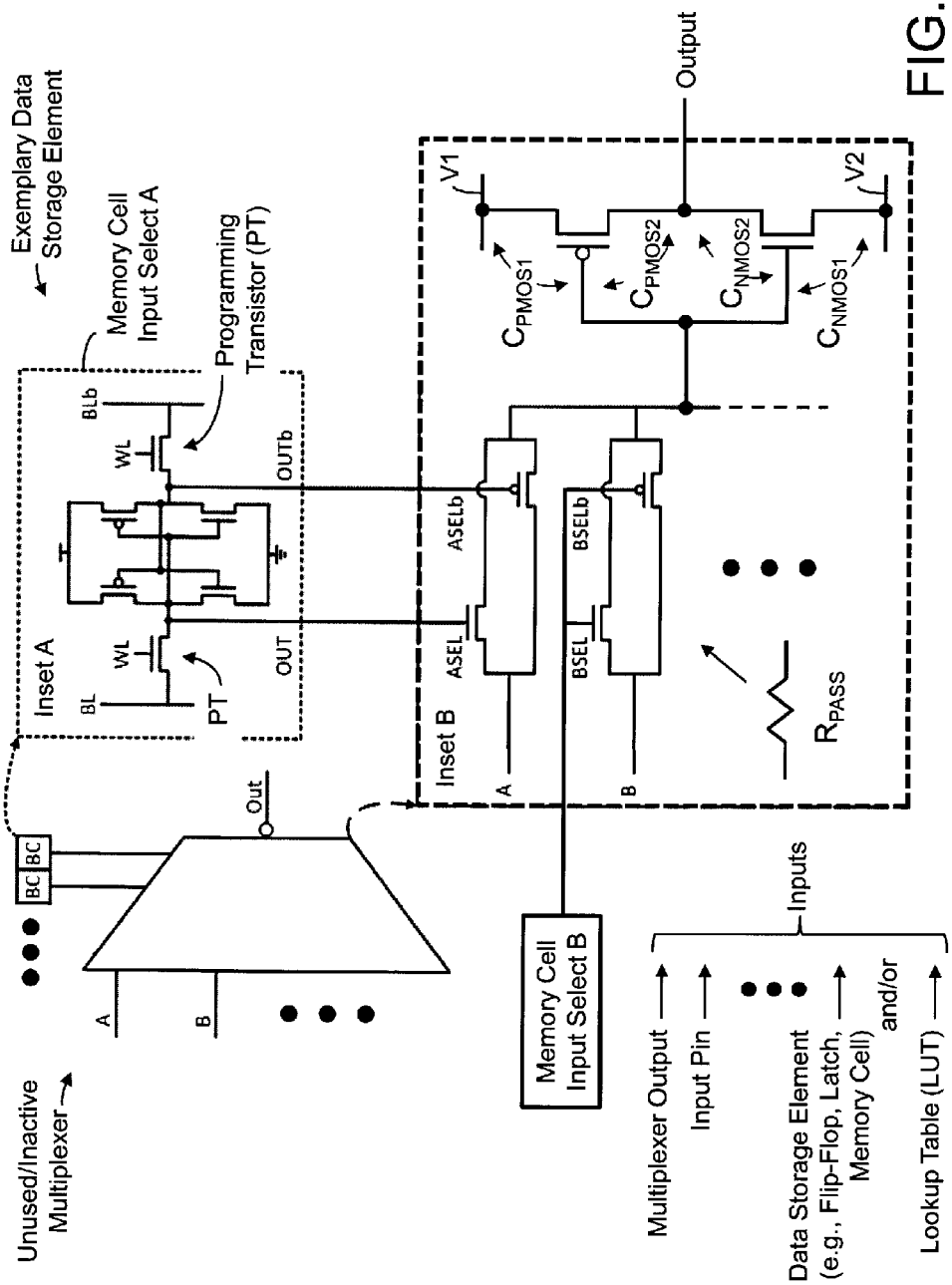
FIG. 4A illustrates an exemplary schematic block diagram representation an N-input inverting multiplexer (where N≥2; i.e., inputs (A, B . . . ) wherein, in this exemplary embodiment, each selection or control input is connected to an associated memory cell in accordance with certain aspects of the present inventions and wherein the data state of the memory cell determines which input(s) of the multiplexer is/are connected to the multiplexer output; notably, Inset A illustrates an exemplary static data storage element (e.g., a static memory cell (which, in this exemplary illustration, is a six-transistor SRAM cell—albeit the static memory cell may be a latch, flip/flop (e.g., a JK-type flip/flop) or any other memory cell or memory cell circuit now known or later developed), and Inset B illustrates an exemplary multiplexer circuit at a transistor and logic level; moreover, in this exemplary embodiment, the multiplexer consists of a plurality of transmission gates and, as such, both the true-and-complement outputs (OUT and OUTb) of each memory cell are routed to respective gate of the NMOS and PMOS transistors of the transmission gates of each input to output propagation path (which, in this exemplary embodiment, routes 2*N input-selection conductors from the memory cells to the associated circuitry in the multiplexer) which drives or is applied to an inverter circuit.

With reference to FIGS. 3A and 4A, an integrated circuit (for example, FPGA) includes a plurality of active multiplexers MUX 1, MUX 4 and MUX 5 (wherein the output of the multiplexer is employed in connection with the operation/configuration of the integrated circuit) and a plurality of unused/inactive multiplexers MUX 2 and MUX 3 (wherein the output of the multiplexer is not used in the current configuration of, for example, a programmable logic component, and/or in the performance of a logic operation in or during normal operation of the integrated circuit). In one embodiment, one or more of the unused/inactive multiplexers (i.e., MUX 2 and/or MUX 3) are configured to increase the amount of decoupling capacitance of the integrated circuit by programming MUX 2 and/or MUX 3 to select one, more, all, or a predetermined number of inputs via control signals b and/or c, respectively.

For example, with particular reference to FIG. 4A, in one exemplary embodiment, data storage elements (which in one exemplary embodiment is illustrated as a memory cell) associated with the unused/inactive multiplexer is/are programmed to select/enable one or more of the inputs and thereby connect such inputs to the output of the multiplexer. Where more than one input is selected or enabled and thereby electrically connected to the multiplexer output, the data states or polarity of the signals applied to the selected inputs are the same. Under this circumstance, a decoupling circuit or path is formed from a voltage V1 (e.g., $V_{DD}$ or power) or a second voltage V2 (e.g., $V_{SS}$ or ground) via a circuit including the parasitic capacitance of the PMOS or NMOS, the select transistors, and the input (to/from, for example, the data storage element). Depending on the data state or polarity of the signal applied to the input, parasitic capacitance $C_{PMOS1}$, $C_{PMOS2}$ of the PMOS transistor of the inverter or $C_{NMOS1}$, $C_{NMOS2}$ of the NMOS transistor are employed as decoupling capacitors and the resistance $R_{PASS}$ of the path or circuit to, for example, the data storage element, is representative the resistance of the decoupling path or circuit. That is, where the data state or polarity of the signal applied to the input is low or "0" or V2, the PMOS transistor of the inverter is on and decoupling path or circuit includes V1, the parasitic capacitance $C_{PMOS1}$, and the selection transistors to the selected input. Because the inverter output is high or "1" or V1 via the PMOS transistor, and the inverter input is low, the decoupling path also includes $C_{PMOS2}$ and $C_{NMOS2}$. In contrast, where the data state or polarity of the signal applied to the selected input is high or "1", the NMOS transistor of the inverter is on and decoupling path or circuit includes V2, the parasitic capacitance $C_{NMOS}$, the selection transistors to the input. Because the inverter output is low or "0" or V2 via the NMOS transistor, and the inverter input is high, the decoupling path also includes $C_{PMOS2}$ and $C_{NMOS2}$.

Notably, where a plurality of inputs of an unused/inactive multiplexer are selected (via programming of the control signal data states (here, the data states are illustrated as being stored in memory cells)), the total resistance $R_{PASS}$ of the path or circuit decreases. As such, in one embodiment, a plurality of inputs of the multiplexer, having the same data state or polarity of the signal applied thereto, are selected/enabled thereby decreasing the resistance $R_{PASS}$ of the decoupling path.

Figure 3B:
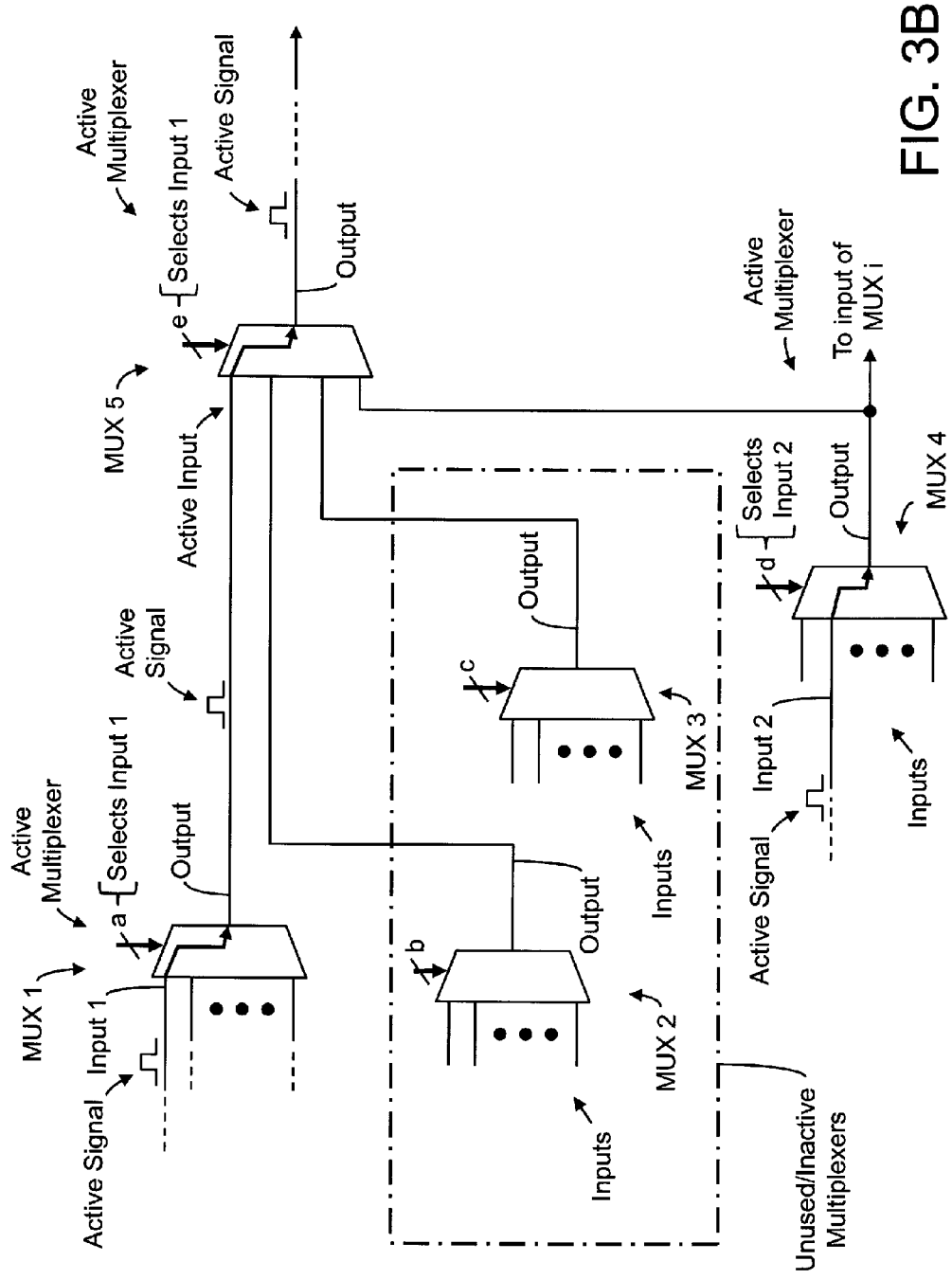
Figure 3C:
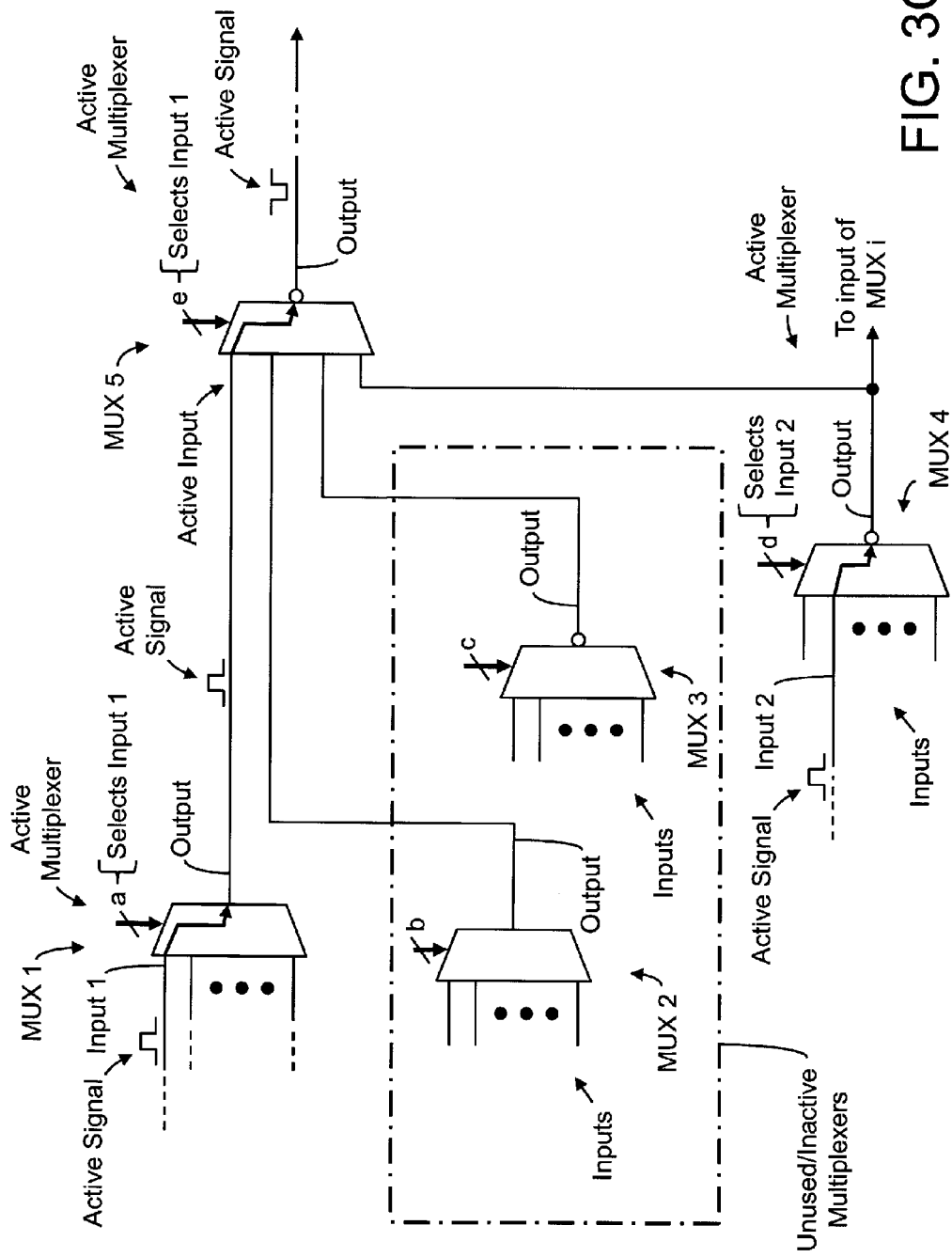

As indicated above, the unused/inactive multiplexers may be any multiplexer configuration or type—including an inverting type or a non-inverting type. (See, for example, FIGS. 2A, 2B, 3A, 3B, 4A and 4B). Moreover, the configurations or types of multiplexers may be used separately or in combination. (See, for example, FIGS. 3B and 3C, respectively).

Figure 3D:
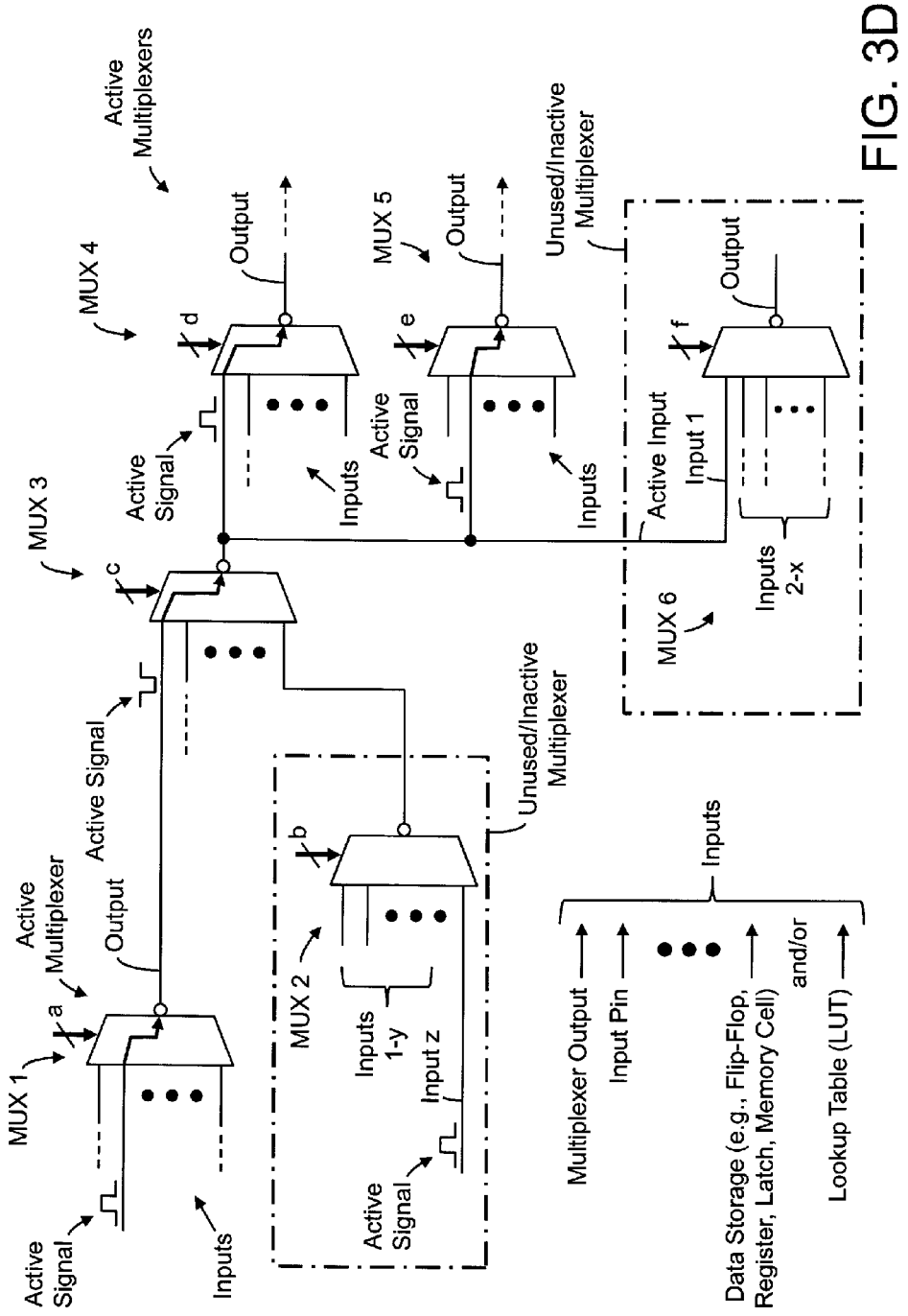
Figure 3E:
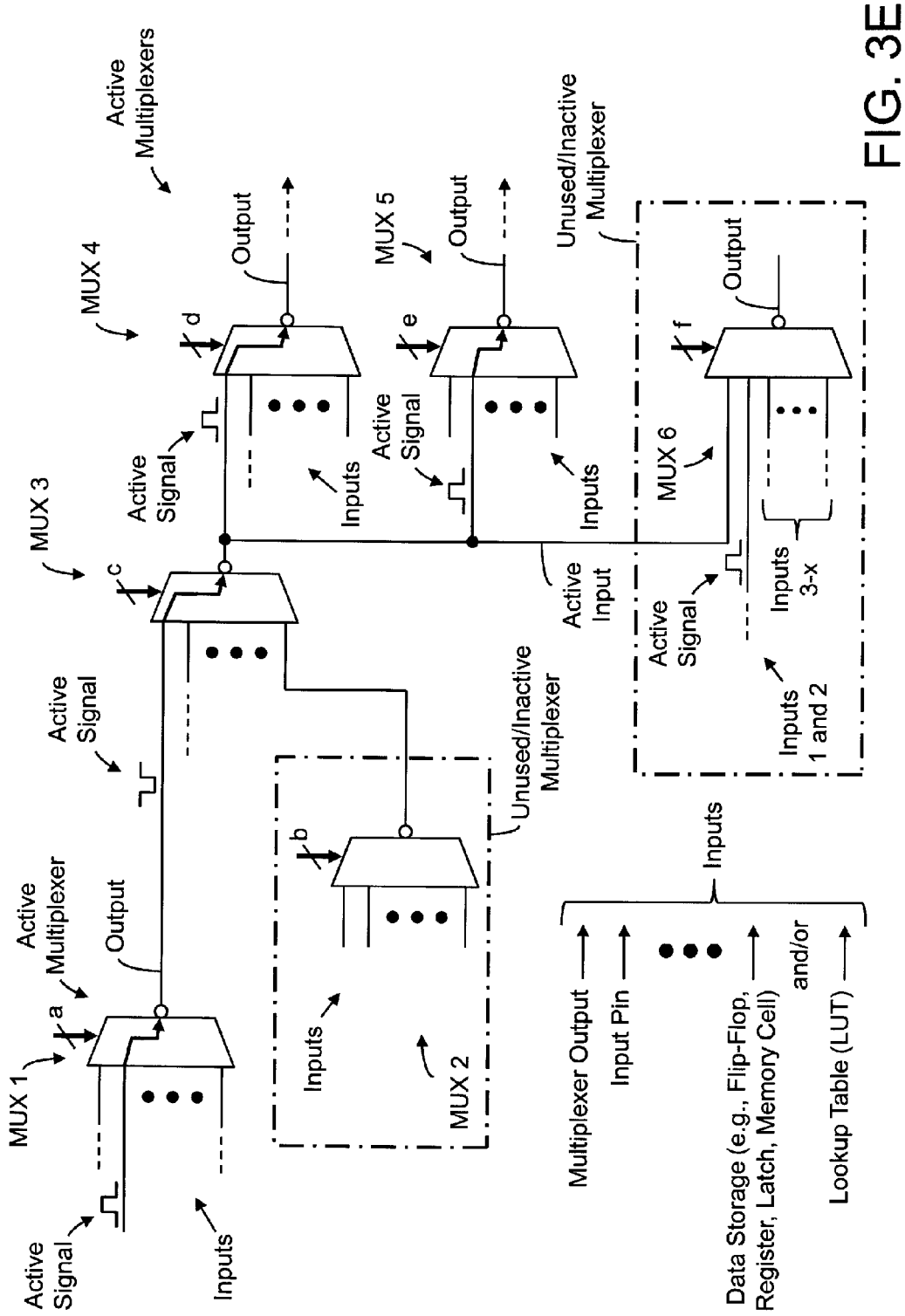

In those embodiments where one or more of the inputs of an unused/inactive multiplexer receive program signal(s) (that is, a signal that is employed to program a configuration of, for example, a programmable logic component, and/or in the performance of a logic operation in or during normal operation of the integrated circuit—see, e.g., Input z of MUX 2 and Input 1 of MUX 6 in FIG. 3D), such multiplexer input may be employed/incorporated in the decoupling path or circuit provided the other inputs that are enabled receive signals have the same data state or polarity as the active signal. (See, for example, Inputs 1-y of MUX 2 and Inputs 2-x of MUX 6 in FIG. 3D). Under these circumstances, one or more of Inputs 1-y of MUX 2 and Inputs 2-x of MUX 6 may be enabled/selected (i.e., the multiplexer input connected to the output) provided the signals applied to such inputs have the same data state or polarity as the signal applied to Input z of MUX 2 or Input 1 of MUX 6. Indeed, one or more (or all or a predetermined number) of the inputs of a multiplexer that receive signals having the same data state or polarity may be incorporated into the decoupling path via suitable programming of the unused/inactive multiplexer. (See, for example, Inputs 1-x of MUX 6 in FIG. 3E). The control circuitry, using the data state or polarity of the signal applied to the inputs of an unused/inactive multiplexer, may coordinate and program the selection of inputs of an unused/inactive multiplexer which are employed/incorporated in the decoupling path or circuit.

Alternatively, in one embodiment, the control circuitry may choose to program the unused/inactive multiplexer so as to not select an input that receives an active signal (whether such signal's data state or polarity is constant or changes). In this embodiment, the one or more other inputs (i.e., Inputs 1-y of MUX 2 and Inputs 2-x of MUX 6 in FIG. 3D) of the unused/inactive multiplexer may be employed and available to be enabled/selected provided the signals applied to such inputs include the same data state or polarity. (See also, Inputs 3-x of MUX 6 in FIG. 3E). Where the inputs receive signals having different data states or polarity (or, for example, a signal is a dynamic-type signal which changes data state during the configured operation of the integrated circuit), the control circuitry may configure or program unused/inactive multiplexer to connect inputs receiving signals having only the same data state (e.g., only a first data state or only a second data state) to the multiplexer output.

As noted above, the inputs of the multiplexers may be electrically connected to one or more data storage elements (e.g., memory cell, register, flip-flop, latch, block/array of memory), input pins, lookup table (LUT) and multiplexer outputs, which "apply" a signal having a data state or polarity to inputs of an unused/inactive multiplexer. The control signals employed to select inputs of the unused/inactive to connect to the multiplexer output are electrically connected to one or more data storage elements and may be programmed (by, for example, the control circuitry) to connect one or more (or all) inputs of an unused/inactive multiplexer to the output of the multiplexer. (See, for example, FIGS. 4A and 4B).

The control circuitry may program the data storage elements associated with the control signals after manufacture, during initialization or at start-up, in situ and/or post-configuration of the integrated circuit. For example, under the circumstances the input signals are binary, in one embodiment, the control circuitry implements an input-output selection where all of the input signal(s) that is/are connected to the multiplexer output has/have a first data state or polarity; in another embodiment, the control circuitry implements an input-output selection where all of the input signal(s) that is/are connected to the multiplexer output has/have a second data state or polarity.

In another aspect (which may be employed in conjunction with the previous aspects of the inventions or separately therefrom), the present inventions are directed to circuitry and methods of providing, modifying and/or adjusting a resistance of the decoupling capacitance path of an integrated circuit by suitably programming one or more static multiplexers of the integrated circuit (via application of appropriate data states to the multiplexer inputs and/or control signals), for example, after manufacture, during initialization or start-up, in situ and/or post-configuration of the integrated circuit. As stated above, a static multiplexer may be characterized as a multiplexer whose input-output selection is static for a current configuration of, for example, a programmable logic component of the currently configured integrated circuit; that is, the control signals applied to the static multiplexer do not change for a given configuration of the integrated circuit.

Figure 3F:
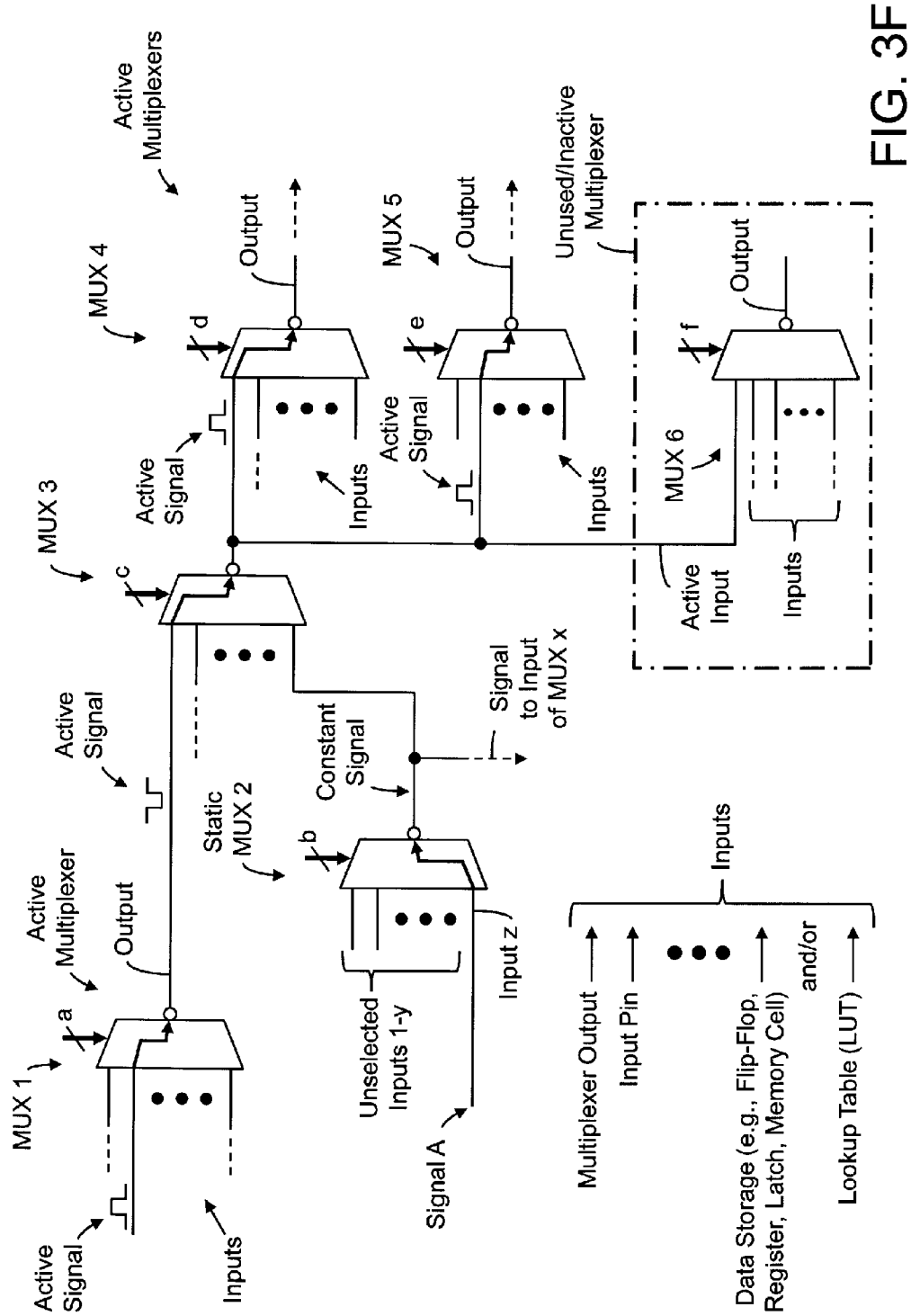

With reference to FIG. 3F, in one embodiment, one or more unselected input(s) of a static multiplexer may be programmed to connect to the output provided the signal(s) applied to the one or more unselected input(s) (i.e., Input 1-$y$ of MUX 2) include the same data state as the data state or polarity of the signal applied to the selected input (i.e., Signal A on Input z of MUX 2). Here, the control signals of the unselected inputs (i.e., Inputs 1-$y$ of MUX 2) are programmed to connect one or more of the unselected inputs to the output of the static multiplexer. In this way, additional circuit paths (via application of appropriate data states to the unselected inputs and/or the control signals associated with such inputs) decrease a resistance of the decoupling capacitance path (RPATH) by selecting or enabling one or more (or all) unselected inputs of the static multiplexer which receive input signals that have the same data state or polarity as the signal applied the selected input. (See, for example, FIGS. 4A, 4B and 5). In one embodiment, control circuitry programs the data storage elements associated with the control signals for the one or more (or all or a predetermined number—as discussed above in the context of increasing the decoupling capacitance (for the sake of brevity, such discussion will not be repeated)) of the unselected inputs of the static multiplexer to enable the input-output path thereof during initialization or at start-up, in situ and/or post-configuration of the integrated circuit.

Notably, in one embodiment, the multiplexer-memory cell circuit is a static type configuration of a certain data state during normal operation, and therefore the control signals applied to the multiplexer corresponding to the selected input, are generally static whereby once the memory cells are programmed with a data state (for example, at power-up or during an initialization sequence) the memory cells corresponding to the selected input are typically not re-programmed during operation of, for example, the current configuration of the integrated circuit.

Figure 4B:
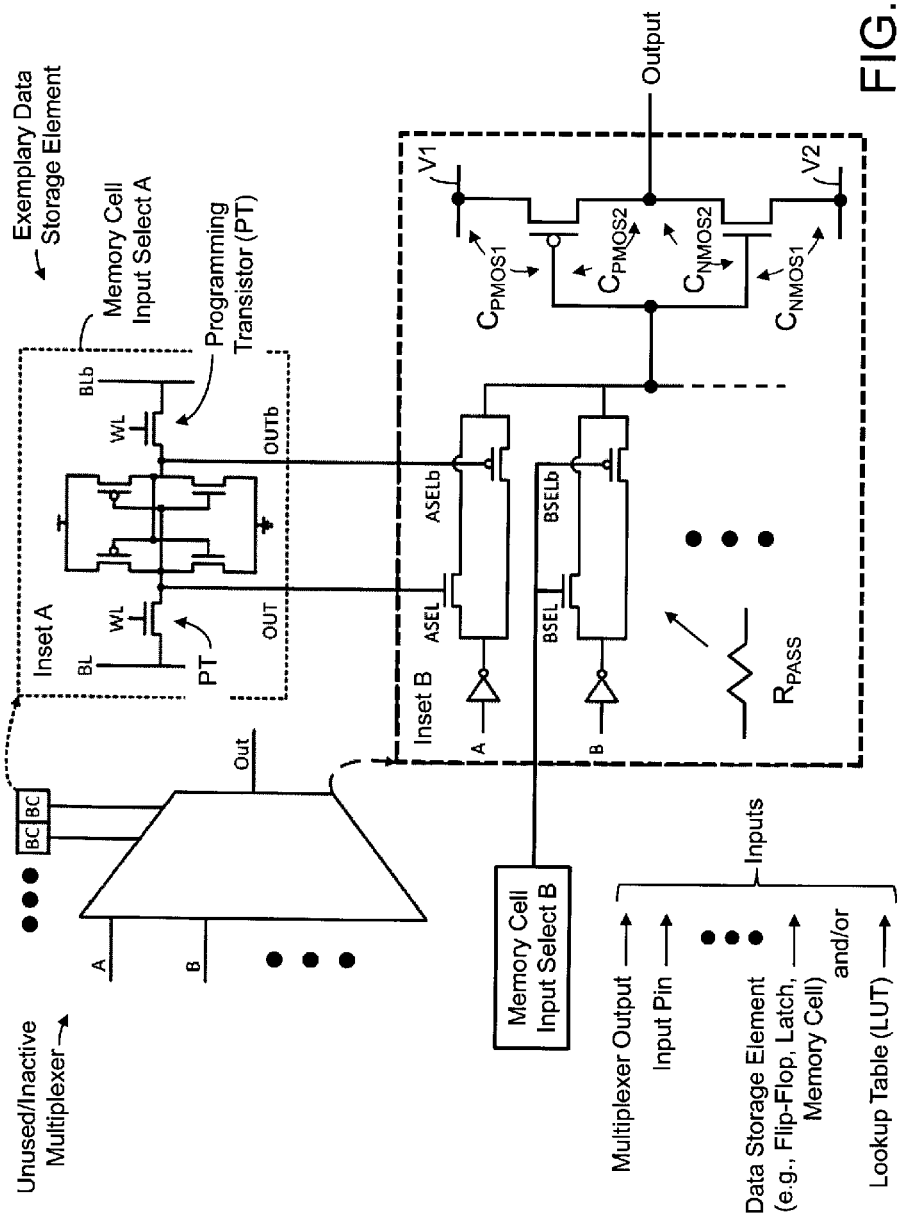
FIG. 4B illustrates an exemplary schematic block diagram representation another N-input multiplexer (where N≥2; i.e., inputs (A, B . . . ) in accordance with certain aspects of the present inventions wherein each selection or control input is connected to an associated data storage element (e.g., memory cell) whose data state determines which input of the non-inverting multiplexer is connected to the multiplexer output; notably, Inset A again illustrates an exemplary static memory cell and Inset B again illustrates an exemplary multiplexer circuit at a transistor and logic level; moreover, the multiplexers of FIGS. 4A and 4B may operate as a one-hot-bit design and, as such, under typical programming only one input-selection is enabled at any given time (otherwise multiple inputs are shorted together); here, however, the multiplexers of FIGS. 4A and 4B may be programmed so that a plurality of input-selections are enabled wherein a plurality of inputs are electrically connected to the multiplexer output; notably, the input (A, B, or . . . ) is initially applied to an inverter and thereafter applied to the transmission gates, wherein the selected input then drives or is applied to an inverter circuit.
Figure 5:
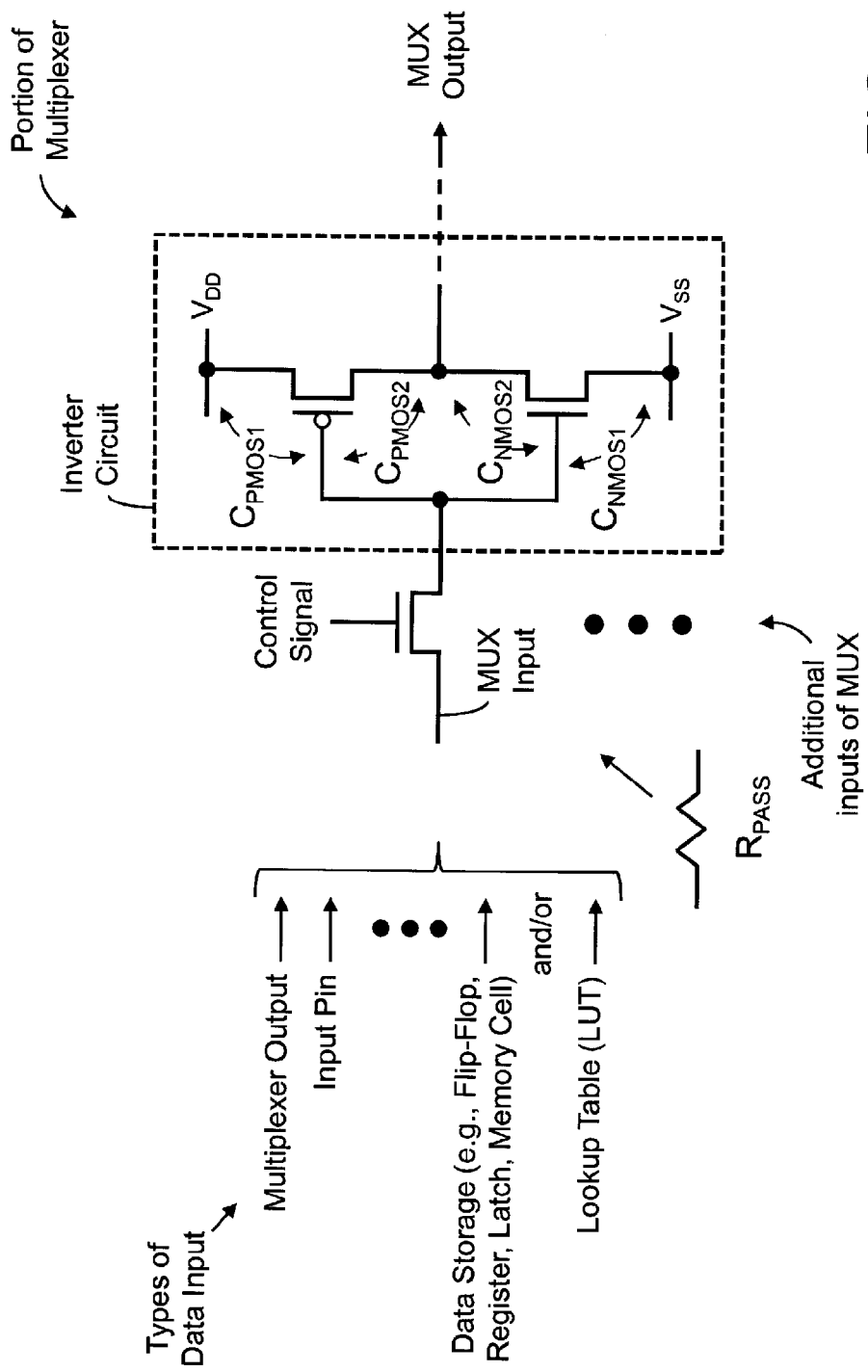
FIG. 5 illustrates an exemplary simplified schematic diagram, in accordance with certain aspects of the present inventions, of one of a plurality of inputs of a multiplexer (which may originate in, for example, a data storage element (e.g., memory cell, register, flip-flop, latch, block/array of memory), an input pin and/or a LUT) wherein the PMOS and NMOS transistors of the inverter circuit include parasitic capacitances $C_{PMOS}$ and $C_{NMOS}$, respectively and a current path from $V_{DD}$ or to $V_{SS}$, respectively, providing a resistance $R_{PASS}$ of a decoupling path; in one aspect of the present inventions, the parasitic capacitance $C_{PMOS}$ or $C_{NMOS}$ and resistance $R_{PASS}$ of unused or inactive multiplexers are incorporated into the decoupling path by suitably programming select or control signals of unused or inactive multiplexers and/or static multiplexers and thereby increasing the decoupling capacitance and/or reducing the resistance of the decoupling path of the integrated circuit.

With reference to FIGS. 4A and 4B, in one embodiment, the multiplexer-memory cell circuit is an N-input multiplexer, N-memory cell configuration (where N≥2) wherein each selection or control input is connected to an associated memory cell. The memory cells may be dynamic or static type cells and, as illustrated, in one embodiment, the memory cells are static type six-transistor SRAM cells (see Inset A of FIG. 2A). Notably, however, static memory cell may be a latch, flip/flop (e.g., a JK-type flip/flop) or any data storage element now known or later developed.

Briefly, with continued reference to FIGS. 4A and 4B, in one embodiment, the multiplexer includes a plurality of transmission gates to control the input-to-output data selection and, as such, in the illustrative embodiment, the true-and-complement outputs (OUT and OUTb) of each memory cell are routed to respective gate of the NMOS and PMOS transistors of the transmission gates of each input to output propagation path (which, in this exemplary embodiment, routes 2*N input-selection conductors from the memory cells to the associated circuitry in the multiplexer) to control or determine input-to-output data selection.

As noted above, "N" of the N-input multiplexer, N-memory cell configuration is greater than or equal to two. For example, where N equals 4, a multiplexer having four inputs (A, B, C, D) wherein each selection or control input is connected to an associated memory cell whose data state determines which input of the multiplexer is connected to the multiplexer output. The Inset A again illustrates an exemplary static memory cell (albeit the static memory cell may be a latch, flip/flop or any other memory cell or memory cell circuit now known or later developed) and Inset B again illustrates an exemplary multiplexer circuit at a transistor and logic level. Notably, the multiplexers of FIGS. 4A and 4B are typically a one-hot-bit design and, as such, only one input-selection is implemented at any given time (otherwise multiple inputs are shorted together). However, in certain embodiments of the present inventions, the multiplexers of FIGS. 4A and 4B may be programmed so that a plurality of input-selections are active (wherein the inputs have the same data states); notably, the input (A, B, or . . . ) is initially applied to an inverter and thereafter applied to the transmission gates, wherein the selected input then drives or is applied to the an inverter circuit; notably, in one embodiment, more than one input-selection may be implemented at any given time.

Figure 3G:
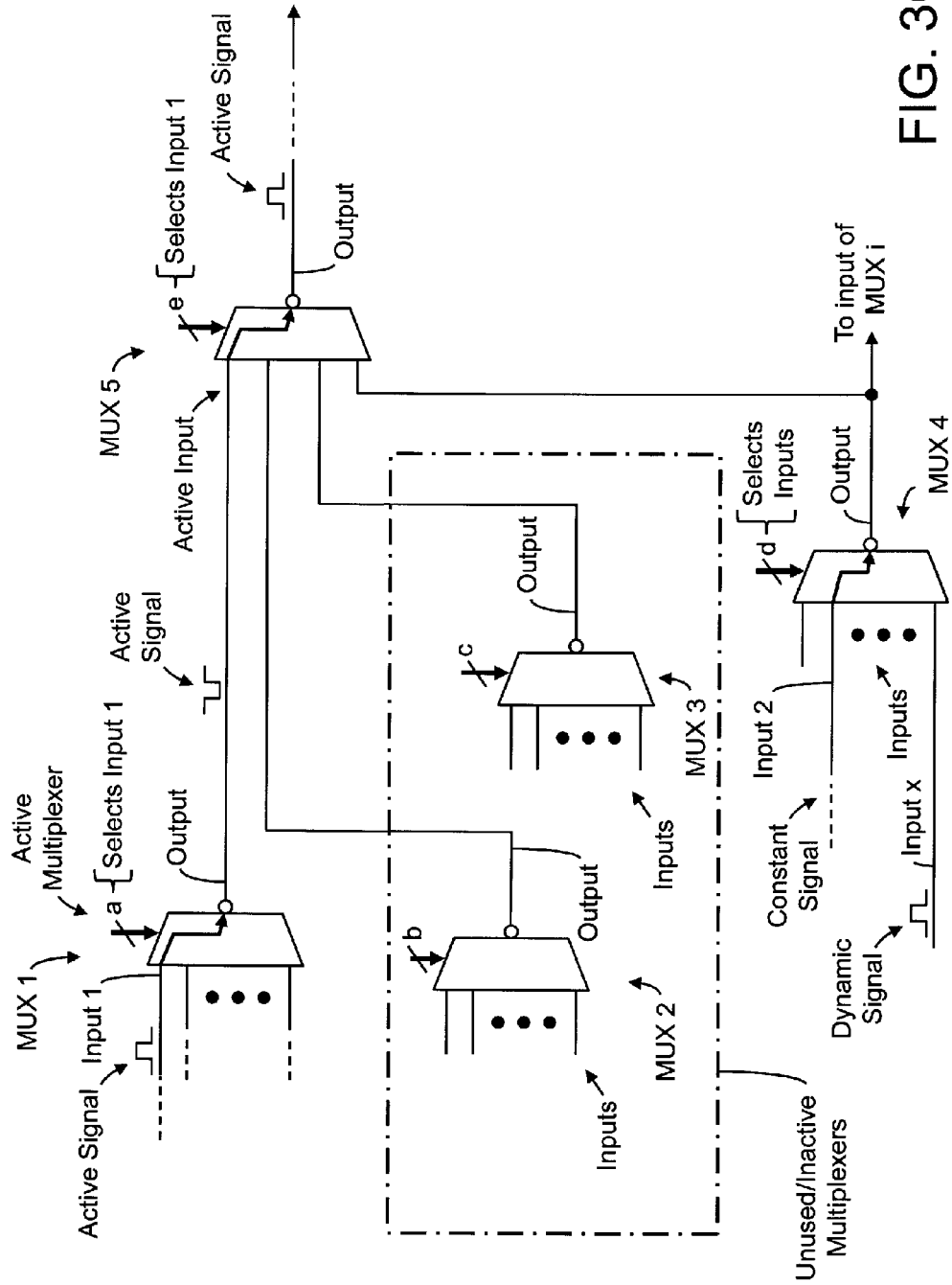

In those embodiments where one or more unselected inputs of a static multiplexer are connected to the output of the static multiplexer, the signals applied to such unselected input(s) will have the same data state as the signal of the selected input. (See, for example, Inputs 1-$y$ and Input z of MUX 2 in FIG. 3F). Where the signal applied to an unselected input of a static multiplexer is dynamic (see, e.g., Input x of MUX 4 in FIG. 3G), such unselected input is unlikely to be enabled given the data state or polarity of the signal is unlikely to be the same as the signal applied to the selected input (i.e., Input 2 of MUX 4). The dynamic signal may be, for example, a signal having a data state that changes during configured operation of the integrated circuit. As such, in these embodiments, the control circuitry may employ the other unused inputs of the static multiplexer to incorporate into the decoupling path or circuit.

Figure 3H:
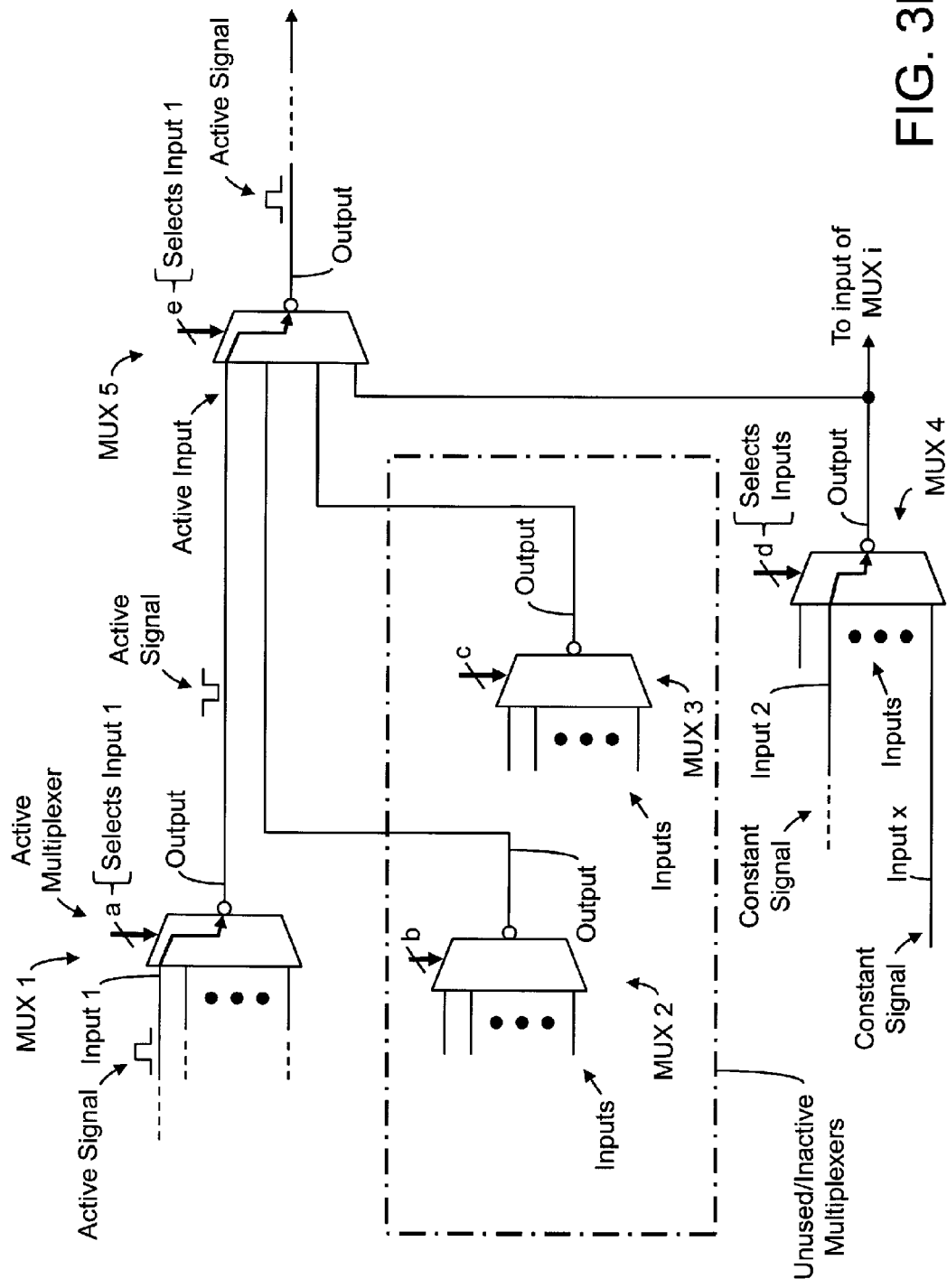

Notably, however, where the signal applied to an unselected input of a static multiplexer is constant (see, e.g., Input x of MUX 4 in FIG. 3H), the control circuitry may enable such unselected input provided the data state or polarity of the constant signal applied to such unselected input is the same as the signal applied to the selected input (i.e., Input 2 of MUX 4 in FIG. 3H). The constant signal may be, for example, a signal having a data state that does not change during operation of the integrated circuit based on its current configuration (which may be different from other configurations of the programmable logic component of the integrated circuit).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Figure 6A:
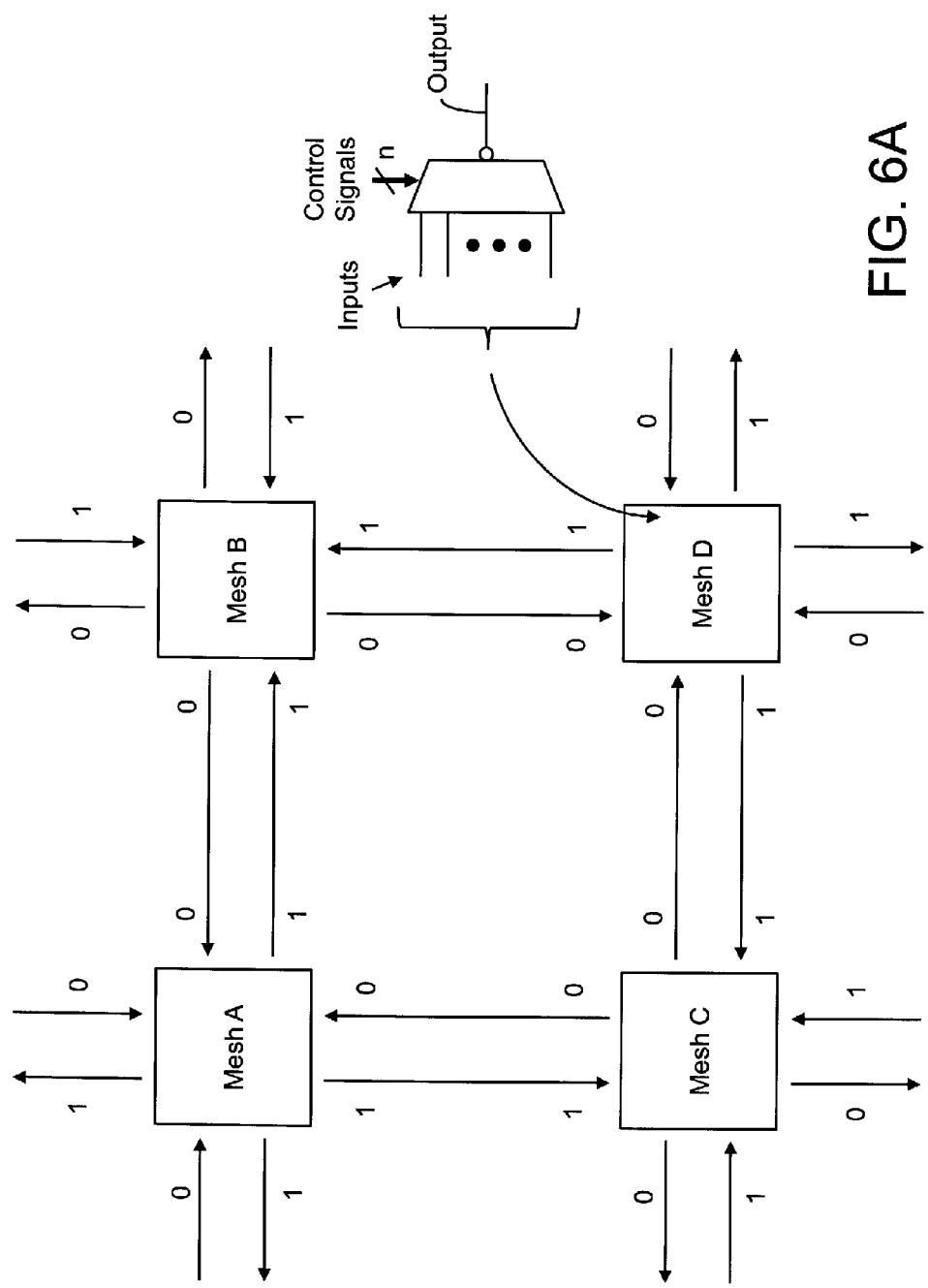
FIG. 6A illustrates an exemplary schematic block diagram representation of a mesh-type network which includes or implements certain aspects of the present inventions wherein certain multiplexers are used or active in connection with the configuration of the integrated circuit in accordance with aspects of the present inventions, wherein one or more (or all) unused or inactive inputs of certain multiplexers of the mesh-type network are programmed (via application of appropriate data states to the multiplexer inputs and control signals associated therewith) to, for example, increasing the decoupling capacitance and/or reduce the resistance of the decoupling path of the integrated circuit via programming static multiplexers as described herein.
Figure 6B:
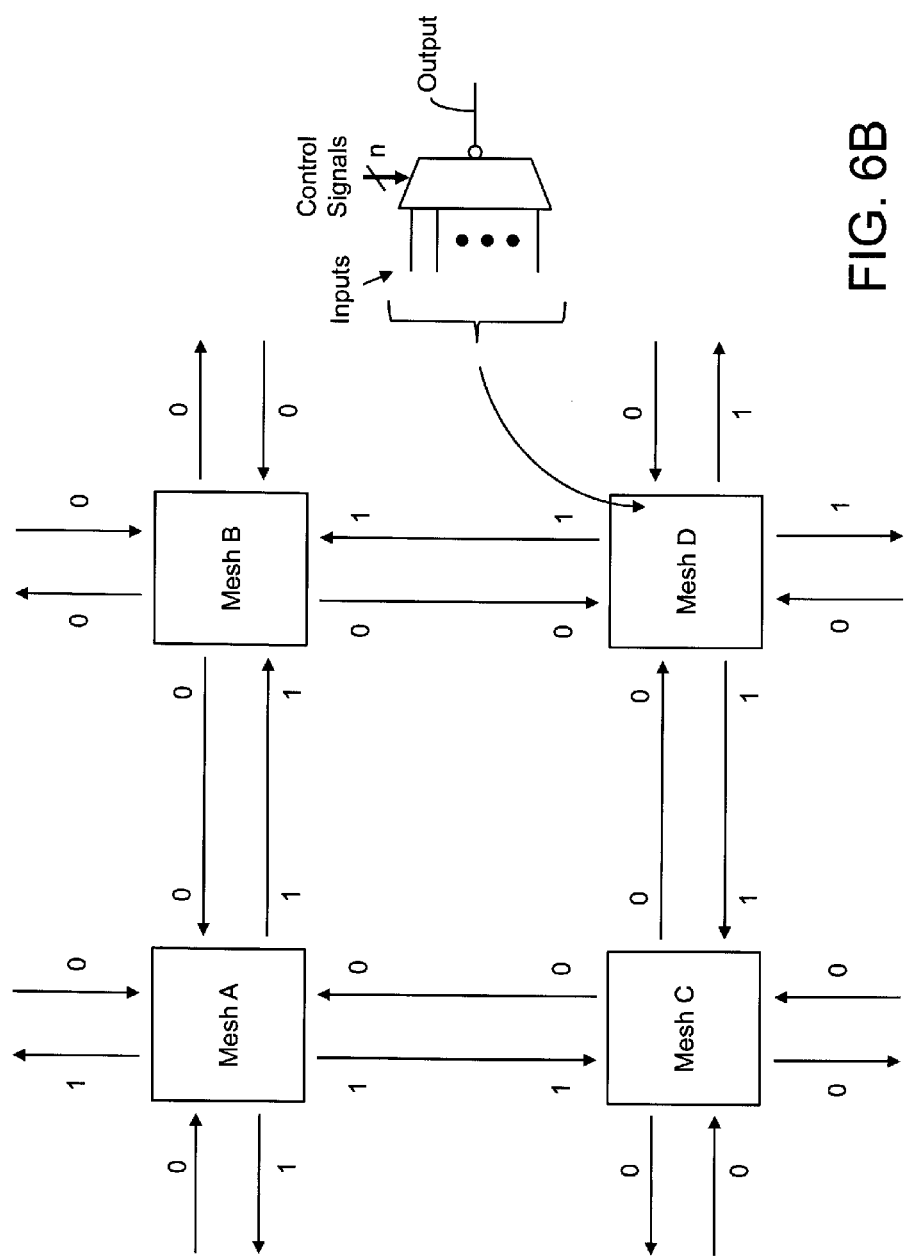
FIG. 6B illustrates an exemplary schematic block diagram representation of a mesh-type network which includes or implements certain aspects of the present inventions wherein certain multiplexers are used or active in connection with the configuration of the integrated circuit in accordance with aspects of the present inventions, wherein one or more unused or inactive inputs are of different polarities (such as inputs into Mesh B and Mesh C), and a certain polarity is chosen (via the applicable algorithms, such as in accordance with FIG. 7B) and programmed (via application of appropriate data states to the multiplexer inputs and control signals associated therewith) to, for example, increasing the decoupling capacitance and/or reduce the resistance of the decoupling path of the integrated circuit via programming static multiplexers as described herein
Figure 7B:
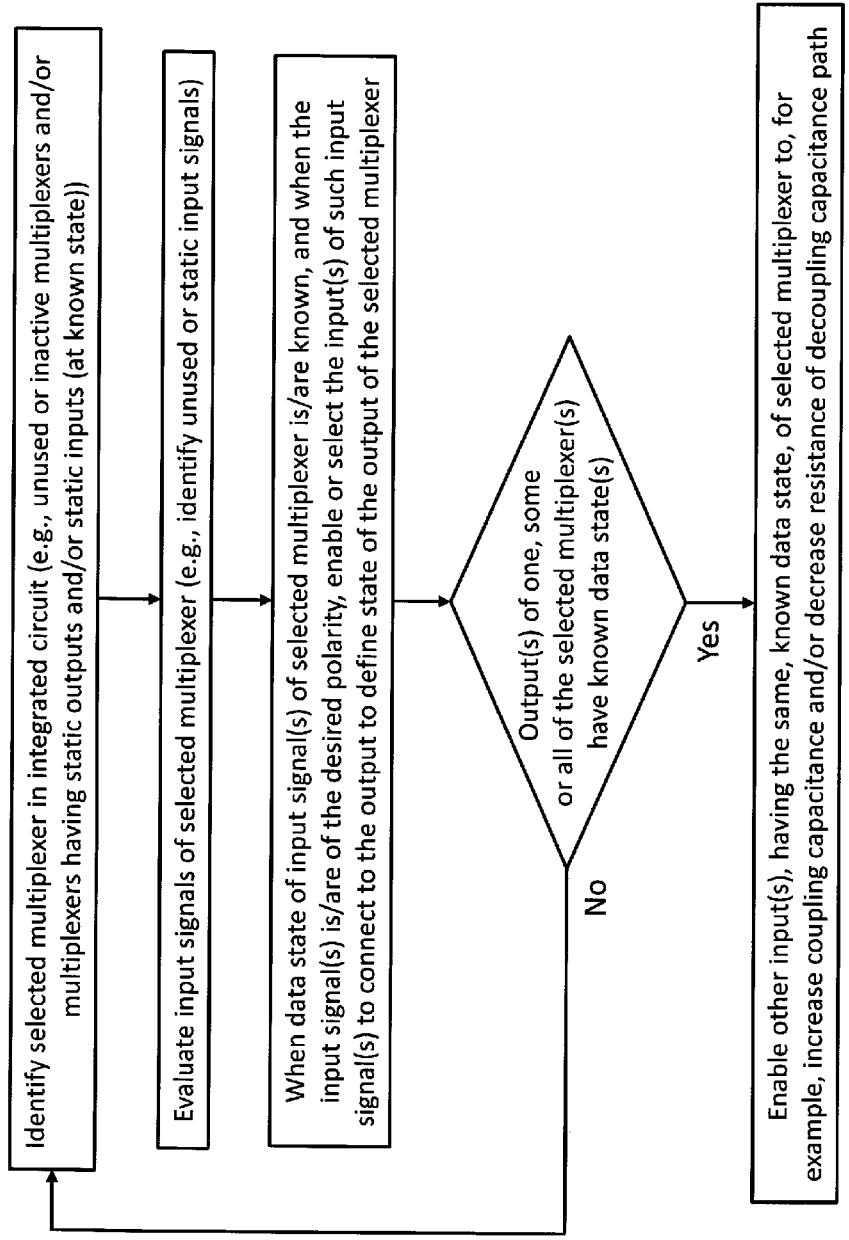
FIG. 7B is a flowchart of exemplary processes of selecting a data state relationship of the multiplexers of the mesh-type network that are inactive and/or have static outputs and/or static inputs (at known state) to implement one or more of inventions described and illustrated herein including controlling a decoupling capacitance and/or a resistance of the decoupling path of an integrated circuit, for example, an FPGA; as noted above, the process of the flow charts are exemplary and the inventions are not limited to processes and/or algorithms implemented in accordance with such flow charts.

For example, the present inventions may be employed in a mesh-type network wherein all of the available unused inputs of the static multiplexers employed to implement or configure the mesh-type network are programmed or configured in the manner described above decrease a resistance of the decoupling capacitance path (RPATH) by programming one or more (or all) unselected inputs of the static multiplexer to the same data state of the selected input and connecting such unselected inputs to the multiplexer output via suitably programming the control signals associated with such inputs (see, for example, FIGS. 5 and 6A) and not connecting other inputs to the multiplexer output via suitably programming the control signals associated with those inputs (see, for example, FIG. 6B). In one embodiment, in addition to enabling the unselected inputs, the control circuitry may also program the data states of the signals applied to one or more (or all) unused inputs of the static multiplexer to be the same as data state of the signal applied to the selected input. For example, the control circuitry may program the data storage elements associated with the unselected inputs to correspond to the data state of the selected input and, in addition, enable such unselected inputs (thereby connecting the unselected inputs to the multiplexer output). (See, for example, the exemplary flowchart illustrated in FIGS. 7A and 7B).

Notably, with reference to FIG. 6A, in one embodiment, the control circuitry may assign or program a particular data state to the signals applied to one or more (or all) unused inputs of the multiplexers of the mesh-type stage or network to increase the decoupling capacitance of the integrated circuit. For example, a data state "0" applied to the input of the multiplexer of Mesh A from the output of the multiplexer of Mesh B produces/generates an output from the multiplexer of Mesh A having a data state "1" to the input of the multiplexer of Mesh B. The data state "1" applied to the input of the multiplexer of Mesh B from the output of the multiplexer of Mesh A produces/generates an output from the multiplexer of Mesh B having a data state "0" to the input of the multiplexer of Mesh A. In this way, the control circuitry may increase the number of inputs applied to the output of the multiplexer and thereby increasing the decoupling capacitance by incorporating parasitic capacitance(s) of transistors of the input-output paths associated with such one or more (or all) of the inputs of unused, inactive or static multiplexers into a decoupling path of the integrated circuit.

With reference to FIG. 6B, in one embodiment, the inputs to the multiplexers may be of different polarities (such as inputs into Mesh B and Mesh C), and a process (implemented, for example, by the control circuitry) may be applied to determine the input polarities to choose to achieve the appropriate amount of decoupling capacitance by incorporating parasitic capacitance(s) of transistors of the input-output paths associated with the chosen inputs. For example, a data state "0" and "1" are both applied to inputs of Mesh B and Mesh C, but if the "0" input is chosen by suitably programming the multiplexers of Mesh B and Mesh C, the output of Mesh B and C would become "1", which would not be utilizable/available by Mesh A and D to increase their decoupling capacitance (Mesh A and D required input polarities of "0" to be usable for increasing decoupling capacitance). Thus, the process (such as the one set forth in FIG. 7B) may chose input "1" for the multiplexers of Mesh B and C, and the output of Mesh B and C becomes "0", which is utilized by Mesh A and D to increase their decoupling capacitance.

Notably, the situations described immediately above with respect to FIGS. 6A and 6B in the context of inverting type multiplexers are also applicable to non-inverting type multiplexers. A discussion in the context where one, some or all of the multiplexers are non-inverting configuration or type will not be repeated here for the sake of brevity. For the avoidance of doubt, however, the embodiments described herein, including those of FIGS. 6A and 6B, may employ any multiplexer configuration or type—including inverting type and/or non-inverting type multiplexers. (See, for example, FIGS. 2A, 2B, 4A and 4B). Moreover, the embodiments may employ such configurations or types of multiplexers separately (i.e., all inverting type multiplexers or all non-inverting type multiplexers) or in combination (i.e., both inverting type and non-inverting type multiplexers).

Further, although the memory cells in certain embodiments are illustrated as a static memory cells, the present inventions may employ dynamic or static memory cells (albeit, it may be advantageous (based on, for example, power consumption) to employ static-type cells). Indeed, as stated above, such static cells may be latches, flip/flops or any other static memory cell or memory cell circuit now known or later developed. Indeed, one or more (or all) of the inputs and/or control signals associated with (i) an unused/inactive multiplexer and/or (ii) a static multiplexer may be electrically connected to, for example, data storage elements (e.g., memory cell, register, flip-flop, latch, block/array of memory), input pins and/or lookup tables—which may be "programmed" after manufacture, during initialization or start-up, situ and/or post-configuration of the integrated circuit (for example, via control circuitry of the integrated circuit or external circuitry).

Notably, any type of multiplexers, whether now known or later developed, may be employed to implement the inventions described and/or illustrated herein. Such multiplexers may be implemented as switches. For example, an interconnect routing or switch network/architecture of switches or multiplexers allows for high-speed communications within an integrated circuit, for example, an FPGA. Here, an FPGA contains various computing elements that communicate in performing operations via the routing or switch network/ architecture. The switches/multiplexers of the routing or switch network often comprise a majority of the area on a FPGA. Indeed, the switches and multiplexers that are or are capable of being employed in the routing or switch network/architecture of an integrated circuit may also be employed to implement the inventions described and/or illustrated herein.

Notably, "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

The techniques described herein may be implemented using control circuitry (for example, one or more processors (suitably programmed)) to perform, execute and/or assess one or more of the functions or operations described herein to program the data storage elements and thereby configure the multiplexers according to the present inventions. Here, the control circuitry (which may be disposed on the integrated circuit) is employed to identify unused or inactive multiplexers and/or static multiplexers during initialization or at start-up, and/or in situ. In one embodiment, the control circuitry evaluates a configuration and determines (i) unused or inactive multiplexers, (ii) static multiplexers, and/or (iii) inactive or unused inputs of such multiplexers. In response, the control circuitry may configure or program (i) one or more (or all) unused or inactive multiplexers, (ii) one or more (or all) static multiplexers, and/or (iii) one or more (or all) unused or inactive inputs of such multiplexers to, for example, increase decoupling capacitance and/or decrease resistance of the decoupling capacitance path via suitably programming the data states of the select signals and/or the input signals of the unused or inactive multiplexer(s).

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the inventive circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as noted above, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

As used in the claims, the terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus. Further, use of the terms "connect", "connected", "connecting" or "connection" throughout this document (including the claims) should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

In the claims, and elsewhere, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. The term "data" may mean, among other things, a current or voltage signal(s) whether in analog or a digital form (which may be a single bit (or the like) or multiple bits (or the like)). Further, the term "logic tile" means a design unit or block of a plurality of transistors (typically more than thousands), which, in this application, is capable of connecting to a plurality of neighboring "tiles", "cores" or "blocks". The term "multiplexers" means multiplexers and/or switches. Moreover, as noted above, the term (i) "integrated circuit" means, among other things, a processor, controller, state machine, gate array, SOC, PGA and/or FPGA. In addition, the term "inactive multiplexer" means an unused or inactive multiplexer.

What is claimed is:

1. An integrated circuit comprising:
control circuitry;
one or more logic tiles, wherein at least one logic tile is connected to the control circuitry and includes:
a plurality of multiplexers interconnected into a network configuration, wherein each multiplexer includes a plurality of inputs, an output, and a plurality of selection inputs to receive selection signals to determine whether an input of the multiplexer is connected to the output of that multiplexer;
an inactive multiplexer including a plurality of inputs, an output that is inactive in the network configuration, and a plurality of selection inputs to receive selection signals to determine whether an input of the inactive multiplexer is connected to the output of the inactive multiplexer; and
wherein, in operation of the integrated circuit, the selection inputs of the inactive multiplexer receive selection signals to concurrently connect two or more inputs of the inactive multiplexer to the output of the inactive multiplexer.

2. The integrated circuit of claim 1 wherein at least one input of the inactive multiplexer is connected to an active multiplexer having an output that is active in the network configuration.

3. The integrated circuit of claim 1 wherein the inactive multiplexer includes a plurality of transistors which, in response to the selection signals, concurrently connect the two or more inputs of the inactive multiplexer to the output of the inactive multiplexer.

4. The integrated circuit of claim 3 wherein parasitic capacitances of the plurality of transistors are included into a decoupling path of the integrated circuit in response to coupling two or more inputs of the inactive multiplexer to the output of the inactive multiplexer.

5. The integrated circuit of claim 1 wherein each of the two or more inputs of the inactive multiplexer is connected to a data storage element, an input pin, a lookup table, and/or an output of another multiplexer of the plurality of multiplexers.

6. The integrated circuit of claim 1 wherein the control circuitry identifies the inactive multiplexer and programs the inactive multiplexer via selection signals applied at the selection inputs of the inactive multiplexer.

7. The integrated circuit of claim 1 wherein the control circuitry identifies the inactive multiplexer and programs the inactive multiplexer via the selection signals applied at the selection inputs of the inactive multiplexer wherein, in response, a predetermined number of inputs of the inactive multiplexer are concurrently connected to the output of the inactive multiplexer.

8. The integrated circuit of claim 7 wherein a polarity of the signals applied to the inputs of the predetermined number of inputs is identical.

9. The integrated circuit of claim 7 wherein the predetermined number of inputs is greater than or equal to two and less than the total number of inputs of the inactive multiplexer.

10. The integrated circuit of claim 7 wherein the predetermined number of inputs is less than the total number of inputs of the inactive multiplexer.

11. An integrated circuit comprising:
control circuitry;
one or more logic tiles, wherein at least one logic tile is connected to the control circuitry and includes:
a plurality of multiplexers interconnected into a network configuration, wherein each multiplexer includes a plurality of inputs, an output, and a plurality of selection inputs to receive selection signals to determine whether an input of the multiplexer is connected to the output of that multiplexer;
an inactive multiplexer including a plurality of inputs, an output that is inactive in the network configuration, and a plurality of selection inputs to receive selection signals to determine whether an input of the multiplexer is connected to the output of the inactive multiplexer;
a static multiplexer including a plurality of inputs, an output that is interconnected into the network configuration, and a plurality of selection inputs; and
wherein, in operation of the integrated circuit,
the selection inputs of the inactive multiplexer receive selection signals which responsively connect two or more inputs of the inactive multiplexer to the output of the inactive multiplexer, and
the selection inputs of the static multiplexer receive selection signals that are static and responsively and concurrently connect two or more inputs of the static multiplexer to the output of the static multiplexer.

12. The integrated circuit of claim 11 wherein the control circuitry identifies the inactive multiplexer and the static multiplexer and programs the inactive multiplexer and the static multiplexer via the selection signals applied to the respective selection inputs wherein, in response,
the two or more inputs of the inactive multiplexer are concurrently connected to the output of the inactive multiplexer, and
the two or more inputs of the static multiplexer are concurrently connected to the output of the static multiplexer.

13. An integrated circuit comprising:
   control circuitry;
   one or more logic tiles, wherein at least one logic tile is connected to the control circuitry and includes:
      a plurality of multiplexers interconnected into a network configuration, wherein each multiplexer includes a plurality of inputs, an output, and a plurality of selection inputs to receive selection signals to determine whether an input of the multiplexer is connected to the output of the multiplexer;
      a static multiplexer including a plurality of inputs, an output that is interconnected into the network configuration and a plurality of selection inputs; and
      wherein, in operation of the integrated circuit, the selection inputs of the static multiplexer receive selection signals that are static and concurrently connect two or more inputs of the static multiplexer to the output of the static multiplexer.

14. The integrated circuit of claim 13 wherein the input signals received at the two or more inputs of the static multiplexer are (i) constant and (ii) an identical polarity.

15. The integrated circuit of claim 13 wherein the static multiplexer includes a plurality of transistors which, in response to the selection signals, concurrently connect the two or more inputs of the static multiplexer to the output of the static multiplexer.

16. The integrated circuit of claim 15 wherein parasitic capacitances of the plurality of transistors are included into a decoupling path of the integrated circuit in response to coupling two or more inputs of the static multiplexer to the output of the static multiplexer.

17. The integrated circuit of claim 13 wherein the control circuitry identifies the static multiplexer and programs the static multiplexer via selection signals applied to the plurality of selection inputs of the static multiplexer.

18. The integrated circuit of claim 13 wherein the control circuitry identifies the static multiplexer and programs the static multiplexer via the selection signals wherein, in response, a predetermined number of inputs of the static multiplexer are concurrently connected to the output of the static multiplexer.

19. The integrated circuit of claim 18 wherein the input signals applied to the inputs of the predetermined number of inputs of the static multiplexer are (i) constant and (ii) an identical polarity.

20. The integrated circuit of claim 18 wherein the predetermined number of inputs is less than the total number of inputs of the static multiplexer.

* * * * *